United States Patent [19]
Hirano et al.

[11] Patent Number: 5,694,445
[45] Date of Patent: Dec. 2, 1997

[54] SEMICONDUCTOR DEVICE WITH MEANS FOR CHARGE RECYCLING

[75] Inventors: Hiroshige Hirano, Nara; Tatsumi Sumi, Osaka, both of Japan

[73] Assignee: Matshushita Electric Industrial Co., Ltd., Osaka, Japan

[21] Appl. No.: 531,294

[22] Filed: Sep. 20, 1995

[30] Foreign Application Priority Data

Sep. 22, 1994 [JP] Japan .................. 6-227920
Sep. 22, 1994 [JP] Japan .................. 6-227922

[51] Int. Cl.⁶ .................................. G11C 19/28
[52] U.S. Cl. ................................................ 377/57
[58] Field of Search .................................... 377/57

[56] References Cited

U.S. PATENT DOCUMENTS 4,987,558  1/1991  Slob ............................ 377/57
5,396,527  3/1995  Schlecht et al. ............ 377/57

FOREIGN PATENT DOCUMENTS 5-135580  6/1993  Japan .

*Primary Examiner*—Margaret Rose Wambach
*Attorney, Agent, or Firm*—Merchant, Gould, Smith, Edell, Welter & Schmidt, P.A.

[57] ABSTRACT

A semiconductor device of the invention is provided with a charge-discharge capacitor and plural charge collecting capacitors which are respectively connected in parallel to the charge-discharge capacitor via switches. The charge-discharge capacitor is not only connected to a power source via a switch but also connected to a circuit for discharging via another switch. By controlling the switches which are used to turn on and off the connections between the charge collecting capacitors and the charge-discharge capacitor, charge is collected to the charge collecting capacitors in order of the electric potential, namely from the lower potential to the higher, and then the charge moves back to the charge-discharge capacitor in reverse order and is recycled. As a result, the charge recycling rate is raised to 50% or more, and the electric power to be consumed can be further decreased. Moreover this invention can be applied to a refresh operation for the identical memory-cell-array. It is preferable to include means for switching charge collecting capacitors to be connected in parallel and in series, so that charge is collected when the charge collecting capacitors are connected in parallel, and the charge is recycled when the charge collecting capacitors are connected in series, so that the charge recycling rate will be further raised.

22 Claims, 19 Drawing Sheets

SEMICONDUCTOR DEVICE WITH MEANS FOR CHARGE RECYCLING

FIELD OF THE INVENTION

This invention relates to a semiconductor device which has means for charge recycling in order to operate with less electric power.

BACKGROUND OF THE INVENTION

A semiconductor device is required to operate with less electric power consumption in order to be driven with a battery. For this purpose, a method to recycle electric charge to the maximum during operation without wasteful discharge is suggested in "1993 SYMPOSIUM ON VLSI CIRCUITS DIGEST OF TECHNICAL PAPERS pp.41–42". The method will be briefly explained referring to FIGS. 24–27. FIG. 24 is a circuit diagram to show the concept of the charge recycling method. FIG. 25 shows the state of the charge when the circuit of FIG. 24 is operating. FIG. 26 is a circuit diagram in which the charge recycling method is applied in the self-refreshing operation of a DRAM. And FIG. 27 shows the operation-timing when the self-refresh system of the DRAM of FIG. 26 is operating.

The outline of a charge recycling method of the conventional technique will be explained referring to FIGS. 24 and 25.

In FIG. 24, C1 and C2 are capacitors and SC1 and SC2 are switches to charge C1 and C2 respectively. SD1 and SD2 are switches to discharge C1 and C2 respectively. ST is a switch to connect C1 and C2 electrically.

In the circuit, a first electrode of C1 is connected to a ground voltage. A second electrode is connected to a supply voltage via SC1, and also connected to the ground voltage via SD1. And a second electrode is connected to a supply voltage via SC2 and also connected to a ground voltage via SD2. Furthermore, a second electrode of C1 and a second electrode of C2 are connected to each other via ST. In FIG. 24, the moving directions of charge at given times (t1–t5) are indicated by arrows. FIG. 25 shows the amount of charge of C1 and C2 at each time (t1–t5).

First, SC1 is turned on at t1 in order that the C1 is charged to act as the supply voltage. Next, ST is turned on at t2, and electric charge is recycled by moving the charge of C1 to C2. When the values of C1 and C2 are the same, the amount of charge of C1 and C2 will be also equal. Then SD1 and SD2 are turned on at t3 to discharge C1 while C2 is charged to be the supply voltage. ST is turned on at t4, and the charge of C2 is moved to C1 in order to recycle the charge. SD2 and SD1 are turned on at t5, and C2 is discharged while C1 is again charged to be the supply voltage. As a result, the state becomes the same as that of t1.

As mentioned above, in the process of charging and discharging of the capacitances, the C1 side and C2 side are operated by turns, so that C1 and C2 can recycle each other's charge. If the values of C1 and C1 are the same, the charge recycling rate is 50%.

An embodiment in which the above-mentioned method for recycling charge is applied to a self-refresh operation of DRAM will be explained referring to FIGS. 26 and 27. FIG. 26 is a circuit diagram and FIG. 27 is a graph of operation timing.

In FIG. 26, MA1 and MA2 are memory-cell-arrays. D1, /D1, D2, and /D2 are data lines. W1 and W2 are word lines. SA1 and SA2 are sense amplifiers. CS is a memory-cell capacitor. CD is a data line capacitor. PD1 and PD2 are precharge-equalizer circuits of data lines. PP1 and PP2 indicate the high-level nodes of the sense amplifiers. PN1 and PN2 indicate the low-level nodes of the sense amplifiers. CC indicates a capacitor for each level node of the sense amplifier.

PS1 and PS2 are precharge-equalizer circuits of level nodes. VDH is the high-level voltage of the sense amplifier. VDL is the low-level voltage of the sense amplifier. DM1 is a switch attached between PP1 of SA1 and VDH, and between PN1 and VDL. DM2 is a switch attached between PP2 of SA2 and VDH, and between PN2 and VDL. ST is a switch attached between SA1 and SA2, PP1 and PP2, and PN1 and PN2. $\phi T$, /$\phi T$, $\phi S1$, /$\phi S1$, $\phi S2$, and /$\phi S2$ are control signals for the respective switches. /$\phi C1$ and $\phi C2$ are control signals for precharge-equalizer circuits (PD1, PD2, PS1, PS2). The mark "/" prefixed to some signals is a symbol of negative logic.

Memory-cell-array MA1 consists of the following elements. A source of memory-cell transistor is connected to a memory-cell capacitor (CS), and a gate is connected to a word line (W1), and a drain is connected to a data line (D1). A precharge-equalizer circuit of data line (PD1) and a sense amplifier (SA1) are respectively connected between a pair of data lines (D1, /D1). SA1 and a precharge-equalizer circuit of level node (PS1) are connected between PP1 and PN1. /$\phi C1$ is input as a control signal of PD1 and PS1. PP1 and PN1 are respectively connected to VDH and VDL via a transistor which is applied with control signal $\phi S1$ or /$\phi S1$ to the gate.

Memory-cell-array (MA2) consists of similar elements. A source of memory-cell transistor is connected to a memory-cell capacitor (CS), and a gate is connected to a word line (W2), and a drain is connected to a data line (D2). A precharge-equalizer circuit of data line (PD2) and a sense amplifier (SA2) are respectively connected between a pair of data lines (D2, /D2). SA2 and a precharge-equalizer circuit of level node (PS2) are connected between PP2 and PN2. /$\phi C2$ is input as a control signal of PD2 and PS2. PP2 and PN2 are respectively connected to VDH and VDL via a transistor whose gate is supplied with control signal $\phi S2$, or /$\phi S2$.

FIG. 27 indicates that control signal (/$\phi C1$) is set to logic voltage "L" if a control signal of self-refresh operation (/RAS) is set to logic voltage "L". As a result, the datalines (D1, D2) and the precharge-equalizer circuits (PD1, PS1) of nodes (PP1, PS1) stop operating. Then a word line (W1) is set to logic voltage "H" and data are read out on a data line (D1). Control signal ($\phi S1$) is set to logic voltage voltage "H" and /$\phi S1$ is set to logic voltage "L", by which SA1 is operated. Accordingly, PP1 becomes VDH and PN1 becomes VDL, and refresh operation of MA1 is completed during t1. At the same time, W1 is set to logic voltage "L", control signal $\phi S1$ is set to logic voltage "L" and /$\phi S1$ is set to logic voltage "H" respectively. The states of PP1 and PN1 become floating.

If the control signal (/RAS) is set to logic voltage "H" and then logic voltage "L", control signal /$\phi C2$ is set to "L". Thus both data lines (D2, /D2) and precharge-equalizer circuits (PD2, PS2) of nodes (PP2, PN2) stop operating. Consequently, a word line (W2) is set to logic voltage "H", and data are read out on a data line (D2). Accordingly, control signal $\phi T$ is set to logic "H", and /$\phi T$ is set to logic voltage "L" respectively during the time (t2–tT). And the Charge of PP1 and PN1 move to PP2 and PN2. In other words, sense amplifier (SA2) operates a little. Next, control signal $\phi S2$ is set to logic voltage "H" and /$\phi S2$ is set to logic voltage "L" respectively, and thus SA2 operates completely. This time, PP2 becomes VDH and PN2 becomes VDL respectively, and the refresh operation of MA2 is completed during t3. In this time, W2 is set to logic voltage "L", control signal φS2 is set to logic voltage "L" and /φS2 is set to logic voltage "H" respectively. Also the states of PP2 and PN2 become floating. Control signal /φC1 is set to logic voltage "H" while the data lines (D1, /D1) and nodes (PP1, PN1) start to be precharged and equalized.

The consequent process is almost the same. Control signal (/RAS) is set to logic voltage "H" and turns to logic voltage "L". Then control signal /φC1 is set to logic voltage "L". As a result, precharge and equalization of data lines (D1, /D1) and nodes (PP1, PN1) are interrupted. Accordingly, a word line (W1) is set to logic voltage "H", and data are read out on a data line (D1). Followingly, control signal φT is set to logic voltage "H" and /φT is set to logic voltage "L" respectively during the time (t4–tT). And the charge of PP2 and PN2 move to PP1 and PN1. In other words, sense amplifier SA1 operates a little. Next, control signal φS1 is set to logic voltage "H" and /φS1 is set to logic voltage "L" respectively, thus SA1 operates completely. Therefore, PP1 becomes VDH and PN1 becomes VDL respectively, and the refresh operation of MA1 is completed during t5. Next, W1 becomes "L", control signal φS1 is set to logic voltage "L" and /φS1 is set to logic voltage "H" respectively. The states of PP1 and PN1 become floating. Control signal /φC2 is set to logic voltage "H", while precharge and equalization of data lines (D2, /D2) and nodes (PP2, PN2) start. And the similar refresh operation will be repeated as much as necessary. As mentioned above, charge is recycled by moving among memory-cell-arrays.

According to the above charge-recycling method to use a conventional semiconductor device, charge moves among at least two memory-cell-arrays, so that such a method is efficient when refresh operations are conducted by turns, e.g. a self-refreshing operation. However, the conventional technique cannot be applied to a refresh operation of an identical memory-cell-array as a usual refresh operation. Another problem is that the charge of a final refresh operation cannot be recycled when the required self refresh operations finish. In addition, according to this method, the charge recycling rate is 50% at most, namely, 50% or more of the charge is not recycled but discharged.

SUMMARY OF THE INVENTION

It is an object of this invention to solve the above-mentioned problems by providing a semiconductor device with charge recycling means which can raise the charge recycling rate to 50% or more and also be applied to refresh operation of the identical memory-cell-array.

In order to accomplish these and other objects and advantages, this invention provides a first example of a semiconductor device which has charge recycling means comprising a charge-discharge capacitor and plural charge collecting capacitors, wherein charge to be collected moves from the charge-discharge capacitor to the charge collecting capacitors in order of the amount of electric potential. Namely, the charge first moves to a charge collecting capacitor with the highest electric potential.

A second example of this invention is a semiconductor device which has charge recycling means comprising a charge-discharge capacitor and plural charge collecting capacitors, wherein charge to be recycled moves to the charge-discharge capacitor from the charge collecting capacitors in order of the potential of the charge collecting capacitors, namely the charge first moves from a charge collecting capacitor with the lowest electric potential.

"Collection of charge" means to move charge in a charge-discharge capacitor to a charge collecting capacitor in order to store the charge. "Charge recycling" means to return the charge stored in the charge collecting capacitor to the charge-discharge capacitor. A semiconductor device with the charge recycling means of this invention enables the raising of the charge recycling rate to 50% or more. Also, the means can be applied to refresh operation of the identical memory-cell-array. It is also possible to store charge after a self-refresh operation and recycle the charge for the next refresh operation.

A third example of this invention is a semiconductor device which has charge recycling means comprising a charge-discharge capacitor and plural charge collecting capacitors, wherein charge to be collected moves to any one of the charge collecting capacitors from the charge-discharge capacitor and then moves to the other charge collecting capacitors in order of the potential, namely the charge first moves to a charge collecting capacitor with the highest electric potential.

A fourth example of this invention is a semiconductor device which has charge recycling means comprising a charge-discharge capacitor and plural charge collecting capacitors, wherein charge to be recycled moves from any one of the charge collecting capacitors to the charge-discharge capacitor and then moves from the other charge collecting capacitor in order of the potential, namely the charge first moves from a charge collecting capacitor with the lowest electric potential.

It is also possible to provide plural charge collecting capacitors.

A fifth example of this invention is a semiconductor device which has charge recycling means comprising a charge-discharge capacitor and plural charge collecting capacitors, wherein the value of the charge collecting capacitors is set to realize the maximum charge recycling rate when charge moves from the charge-discharge capacitor to the charge collecting capacitors and then moves back to be recycled to the charge collecting capacitors.

A sixth example of this invention is a semiconductor device which has charge recycling means comprising plural charge-discharge capacitors and plural charge collecting capacitors, wherein charge to be collected moves from the charge-discharge capacitors in order of the electric potential, namely charge moves first from a charge-discharge capacitor with the lowest electric potential.

A seventh example of this invention is a semiconductor device which has charge recycling means comprising plural charge-discharge capacitors and plural charge collecting capacitors, wherein charge to be recycled moves from the charge-discharge capacitors in order of the electric potential, namely charge moves first from a charge collecting capacitor with the lowest electric potential.

A eighth example of this invention is a semiconductor device which has charge recycling means comprising plural charge-discharge capacitors and plural charge collecting capacitors, wherein charge to be collected moves from one of the charge-discharge capacitors to one of the charge collecting capacitors and then to the other charge collecting capacitors in order of the electric potential, namely charge moves first to a charge collecting capacitor with the highest electric potential.

A ninth example of this invention is a semiconductor device which has charge recycling means comprising plural charge-discharge capacitors and plural charge collecting capacitors, wherein charge to be recycled moves from one of the charge collecting capacitors to one of the charge-discharge collecting capacitors and then from the other charge capacitors in order of the potential, namely charge moves from a charge collecting capacitor with the lowest electric potential.

A tenth example of this invention is a semiconductor device which has charge recycling means comprising plural charge-discharge capacitors and plural charge collecting capacitors, wherein the values of the charge-discharge capacitors and of the charge collecting capacitors are set to realize the maximum charge recycling rate when charge moves from the charge-discharge capacitors to the charge collecting capacitors and moves back to be recycled to the charge-discharge capacitors.

An eleventh example of this invention is a semiconductor device which has charge recycling means comprising a first capacitor and a second capacitor which is a charge collecting capacitor, wherein the first capacitor is connected to a power source for charging via a first switch and also connected to a circuit for discharging via a second switch, and the first and the second capacitors are connected to each other via a third switch.

A twelfth example of this invention is the semiconductor device according to the eleventh example, which has charge recycling means, wherein charge moves from the second capacitor to the first capacitor via the third switch, and moves from the first power source to the first capacitor via the first switch, and moves from the first capacitor to the second capacitor via the third switch in order to be collected, and from the first capacitor to the circuit for discharging, and thus discharging is conducted.

A thirteenth example of this invention is the semiconductor device according to the eleventh example, which has charge recycling means, wherein the value of the second capacitor is set to equal or exceed the value to maximize the average amount of collected charge if charge is collected at least twice.

A fourteenth example of this invention is a semiconductor device which has charge recycling means comprising one charge collecting capacitor and plural capacitors, wherein the plural capacitors are connected to a power source for charging via each of the first switches and also connected to a circuit for discharging via each of the second switches, and the charge collecting capacitor and the capacitors are connected to each other via each of the third switches.

A fifteenth example of this invention is a semiconductor device which has charge recycling means comprising a charge-discharge capacitor and plural charge collecting capacitors.

A sixteenth example of this invention is the semiconductor device semiconductor device according to claim 15, which has charge recycling means, wherein some or all of the charge collecting capacitors can be switched between parallel connection and series connection.

A seventeenth example of this invention is the semiconductor device according to the sixteenth example, which has charge recycling means, wherein charge to be collected moves to the charge collecting capacitors when some or all of the charge collecting capacitors are connected in parallel.

An eighteenth example of this invention is the semiconductor device according to the sixteenth example, which has charge recycling means, wherein the charge of the charge collecting capacitors is recycled when some or all of the charge collecting capacitors are connected in series.

By combining the two examples described above, more charge can be recycled. For this purpose, charge is collected when plural charge collecting capacitors are connected in parallel and the charge is recycled by switching the parallel connection to a series connection.

A nineteenth example of this invention is the semiconductor device which has charge recycling means, wherein the charge of charge collecting capacitors is recycled while a number (N) of the charge collecting capacitors are connected in series, and then charge of the charge collecting capacitors is recycled while the charge collecting capacitors of the number of (N+1) are connected in series, when N is at least two.

A twentieth example of this invention is a semiconductor device which has charge recycling means comprising at least three charge-discharge capacitors, wherein the charge of the first charge-discharge capacitor to be collected moves to the second and the third charge-discharge capacitors.

A twenty-first example of this invention is a semiconductor device which has charge recycling means comprising at least three charge-discharge capacitors, wherein the charge of the first charge-discharge capacitor to be collected moves to the second and the third charge-discharge capacitors in order of the electric potential, namely charge moves first to the charge-discharge capacitor with the higher electric potential.

A twenty-second example of this invention is a semiconductor device which has charge recycling means comprising at least three charge-discharge capacitors, wherein the charge of the second and third charge-discharge capacitors to be recycled moves to the first charge-discharge capacitor in order of the electric potential, namely charge moves first from the charge-discharge capacitor with the lower electric potential.

BRIEF DESCRIPTION OF THE DRAWINGS

FIGS. 2–5 show the charging state of each capacitor when the charge recycling is being operated with the semiconductor device of FIG. 1.

FIG. 9 shows the charging state of each capacitor when the charge recycling is being operated with the semiconductor device of FIG. 8.

DETAILED DESCRIPTION OF THE INVENTION

This invention will be described by referring to the attached figures. The embodiments are not intended to limit the invention in any way.

Figure 6:
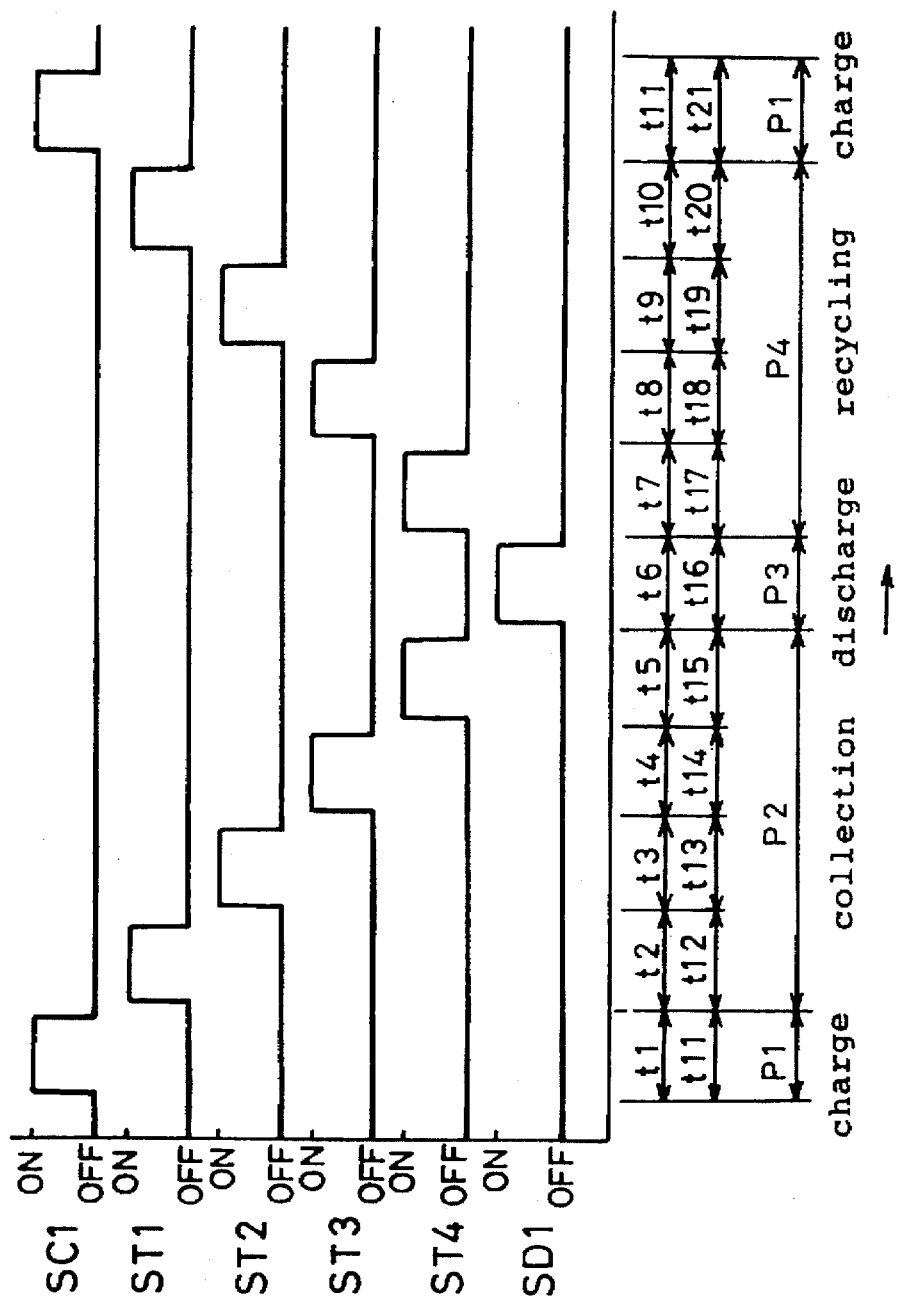
FIG. 6 shows the operation timing when the charge recycling is being operated within the semiconductor device of FIG. 1.
Figure 7:
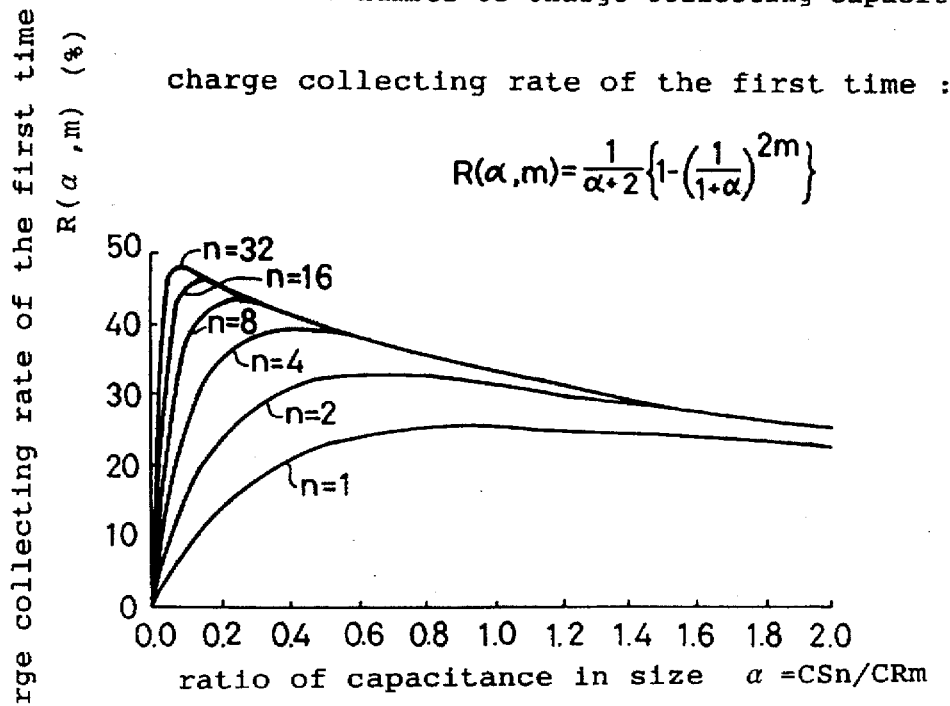
FIG. 7 is a graph to indicate the relation between the rate of charge collection and the capacitance ratio of charge-discharge capacitor to charge collecting capacitor according to the semiconductor device of FIG. 1.

The first embodiment will be described by referring to FIG. 1 that shows a circuit, FIGS. 2 to 5 that show the state of charge (the charging state of each capacitance), and FIG. 6 that shows the timing. FIG. 7 shows the relation between the charge collecting rate and the capacitance ratio of charge-discharge capacitance to charge collecting capacitance according to this embodiment.

Figure 1:
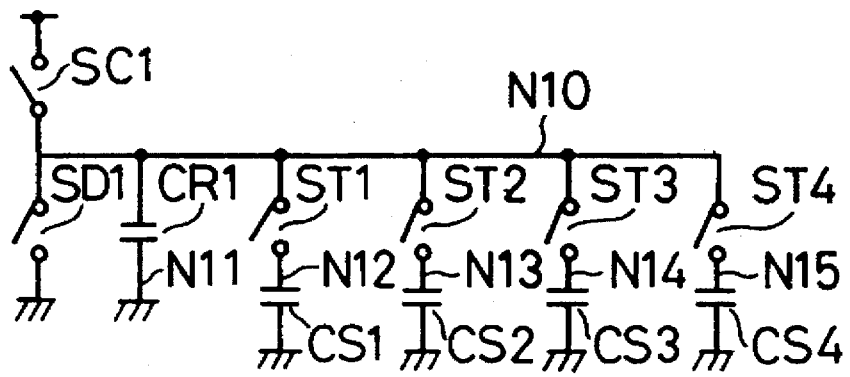
FIG. 1 is a circuit diagram which shows a concept of a charge recycling method conducted with the semiconductor device according to the first embodiment of the present invention.

In FIG. 1, CR1 is a charge-discharge capacitor, CS1–CS4 are charge collecting capacitors, SC1 is a switch for charging, SD1 is a switch for discharging, ST1–ST4 are switches to connect-disconnect the charge collecting capacitor, and N10–N15 are nodes. SC1 is connected between a supply voltage and N10, SD1 is connected between a ground voltage and N10, and CR1 is connected between N10 and a ground voltage. Switches (ST1–ST4) are connected between N10 and other nodes (N12–N15) respectively, and CS1–CS4 are connected between the nodes (N12–N15) and a ground voltage respectively.

Figure 2:
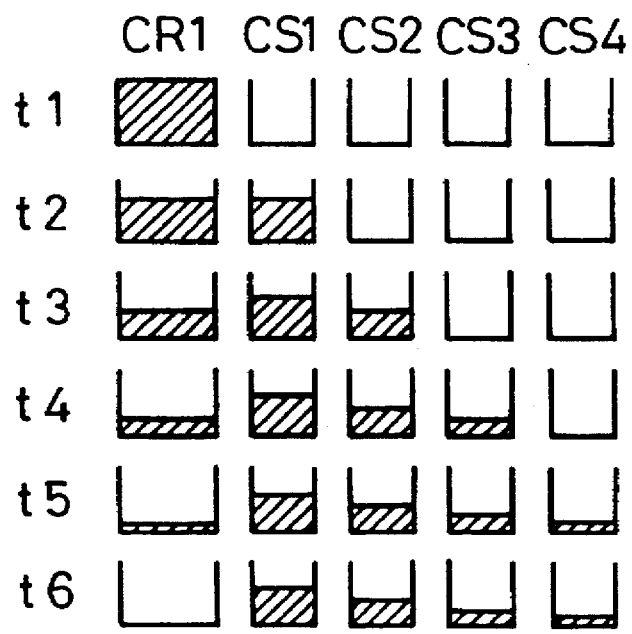

The first charge collection will be described referring to FIGS. 2 and 6. In FIG. 6, CR1 is charged during charging period P1. During the charge collecting period P2, the charge of CR1 is collected in CS(1–4). During discharging period P3, the rest of the charge of CR1 is discharged. The operation will be described in detail later.

During t1, all switches except SC1 are turned off, and CR1 is charged to be a ground voltage. During t2, SC1 is turned off while ST1 is turned on, and the charge of CR1 is partly collected in CS1. During t3, ST1 is turned off while ST2 is turned on, and the remaining charge of CR1 is partially collected in CS2. During t4, ST2 is turned off while ST3 is turned on, and the remaining charge of CR1 is partially collected in CS3. During t5, ST3 is turned off while ST4 is turned on, and the remaining charge of CR1 is partially collected to CS4. During t6, ST4 is turned off while SD1 is on, and the rest of the charge of CR1 is collected.

The first charge recycling is described below referring to FIGS. 3 and 6. As mentioned above, it is apparent from FIG. 6 that after the rest of the charge of CR1 is discharged, the charge stored in CR (1–4) is recycled in the charge-recycling period P4, and CR1 is recharged during P1.

The operation also can be described as follows. During t6, all switches except for SD1 are turned off, and the charge of CR1 is discharged. During t7, SD1 is turned off while ST4 is turned on, and the charge of CS4 is returned to CR1. During t8, ST4 is turned off while ST3 is turned on, and the charge of CS3 recycled to CR1. During t9, ST3 is turned off while ST2 is turned on, and the charge of CS2 is recycled to CR1. During t10, ST2 is turned off while ST1 is turned on, and the charge of CS1 recycled to CR1. And during t11, ST1 is turned off while SC1 is turned on, and CR1 is charged to be a supply voltage.

Figures 3, 4:
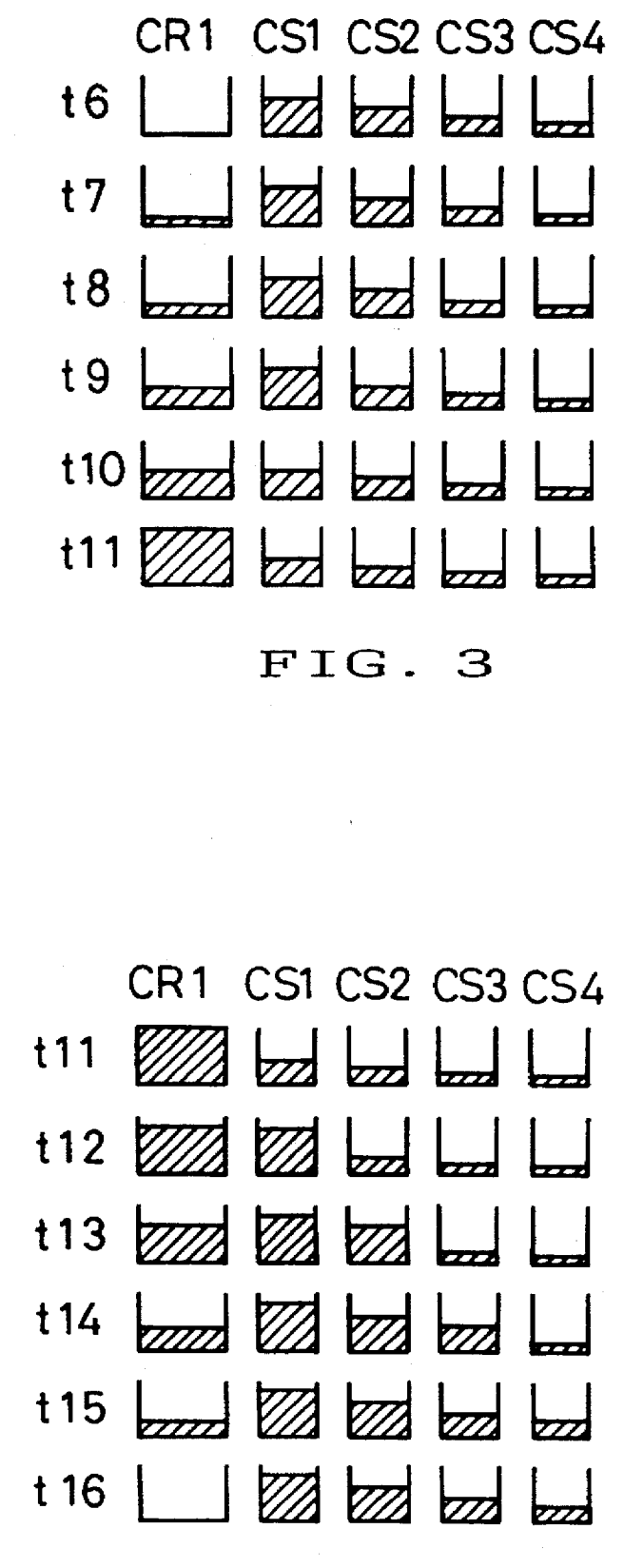

FIG. 4 shows the second collection of charge. The first operation of charge collection is repeated during t12–t16 of FIG. 6. In the second collection, more charge is collected than in the first operation, since charge-discharge capacitors (CS1–CS4) have been more charged.

Figure 5:
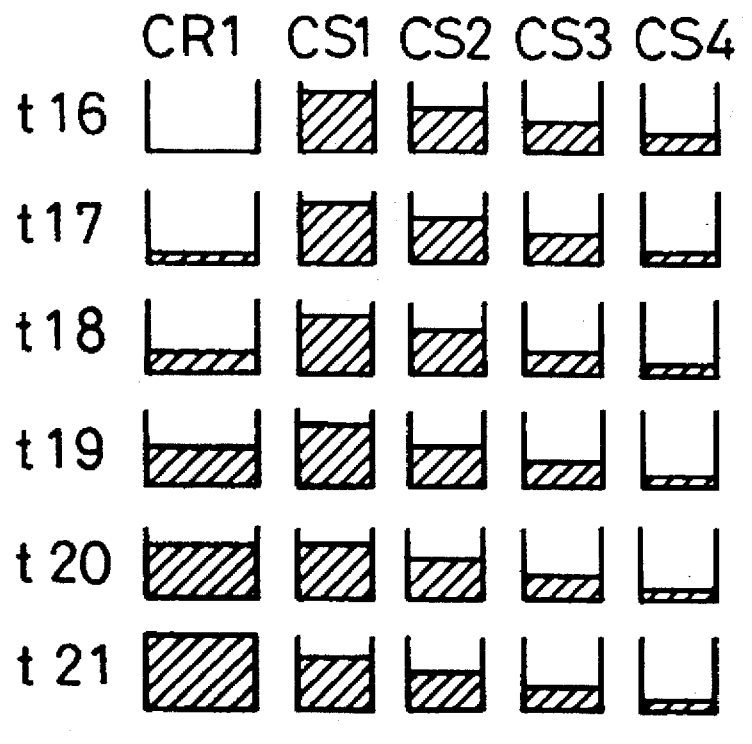

FIG. 5 shows the second recycling of charge. The first operation of charge collection is repeated during t16–t21 of FIG. 6. In the second recycling, more charge is recycled than in the first operation, since the amount of charge of CS1–CS4 exceeds that of the first operation.

The above-mentioned operations are repeated to collect and recycle the charge. As a result of such operations, the amount of charge which is collected and recycled approaches a certain value.

FIG. 7 shows the relation between charge collecting rate and the capacitance ratio of the capacitance of charge-discharge capacitors (CRm) to the capacitance of charge collecting capacitors (CSn). When the number of charge-discharge capacitor is 1, m=1, namely, charge-discharge capacitor CR means CR1. Charge collecting capacitor CSn corresponds to charge collecting capacitors (CS1–CS4), namely when the number of the charge collecting capacitors is 4, n=4. When the value of m is 1 and $\alpha$ means CSn/CRm, and the number of the charge collecting capacitors is described as n, the first charge collecting rate R ($\alpha$, m) can be expressed by the following formula:

$$R(\alpha, m) = 1/(\alpha+2) \times (1 - 1/(1+\alpha)^{2m})$$

In FIG. 7, the relation between the formula ($\alpha$=CSn/CRm) and charge collecting rate R ($\alpha$, m) is shown when n=1, 2, 4, 8, 16, or 32. It is clear from the graph that each condition has its best value. In this embodiment, the number of the charge collecting capacitors is four (n=4). Therefore the first charge collecting rate reaches a maximum when $\alpha$ is about 0.5. In other words, the first charge collecting rate reaches a maximum if the value of charge collecting capacitance (CS1–CS4) is determined to be the half of the charge-discharge capacitance CR1. Though the first charge collecting rate is about 40%, the rate rises, for example to 70%, after repetition of collecting and recycling of charge.

In the first embodiment, the charge collecting rate is higher (e.g. 70%) than the 50% obtained with conventional techniques, and thus it provides operation with less electric power. The above-mentioned method to recycle charge can also be applied to a self-refresh operation of DRAM shown in the prior art.

Figure 8:
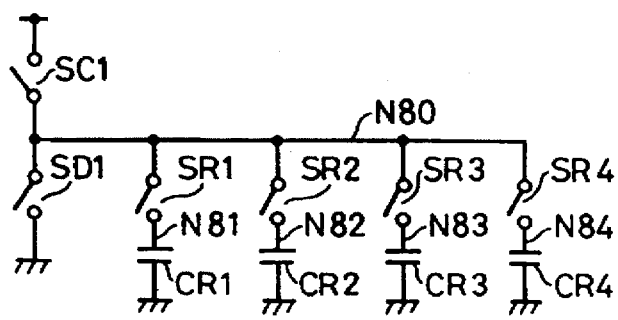
FIG. 8 is a circuit diagram which shows a concept of a charge recycling method conducted with the semiconductor device according to the second embodiment of the invention.
Figure 9:
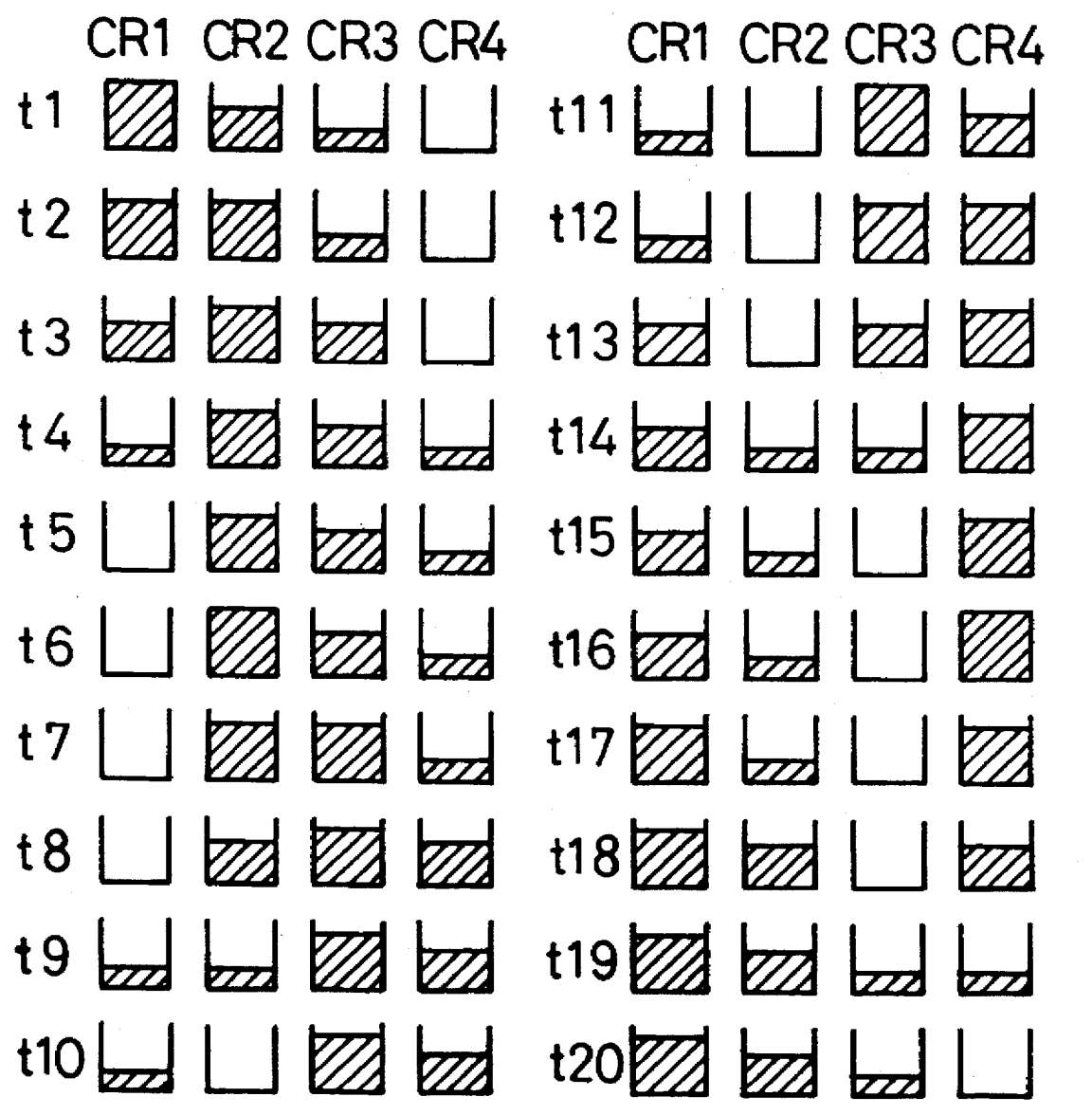
Figure 10:
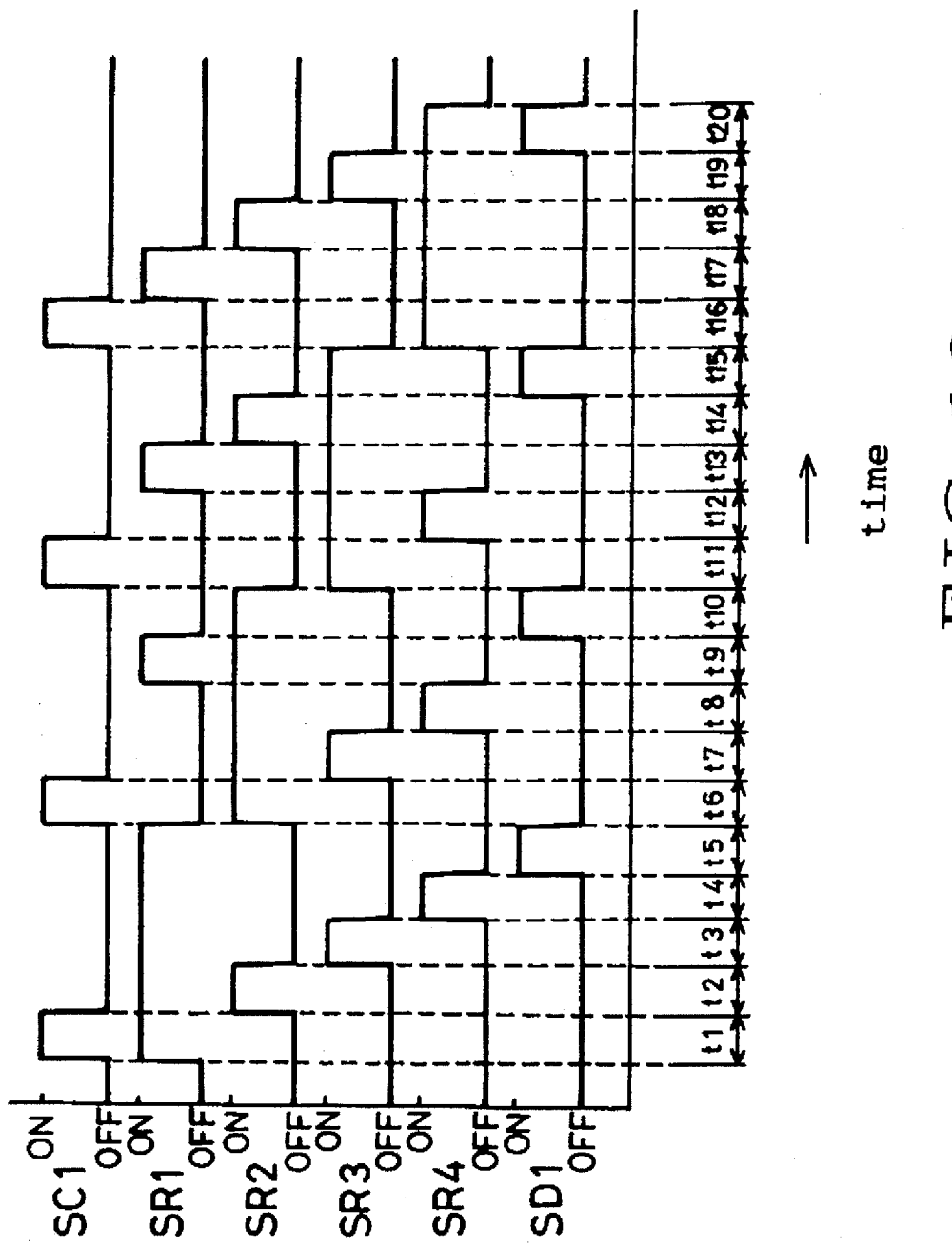
FIG. 10 shows the operation timing when the charge recycling is being operated with the semiconductor device of FIG. 8.

The second embodiment is described by referring to FIG. 8 that shows a circuit, FIG. 9 that shows the charging state of each capacitance, and FIG. 10 that shows the timing. In FIG. 8, CR1–CR4 are used as charge collecting capacitors as well as charge-discharge capacitors. SC1 is a switch for charging, SD1 is a switch for discharging, SR1–SR4 are switches for connecting charge-discharge capacitors, and N80–N84 identify nodes names. SC1 is connected between a supply voltage and N80, SD1 is connected between a ground voltage and N80, CR1–CR4 are connected between each node (N80–N84) and a ground voltage, and SR1–SR4 are connected between N80 and nodes (N81–84) respectively.

During t1, all switches except SC1 and SR1 are turned off, and CR1 is charged to be a supply voltage. During t2, SR1 and SR2 are turned on while the others are turned off, and the charge of CR1 moves to be collected to CR21. During t3, SR1 SR3 are turned on while the others are turned off, and the charge of CR1 is collected in CR3. During t4, SR1 and SR4 are turned on while the others are turned off, and the charge of CR1 is collected in CR4. During t5, SR1 and SD1 are turned on while the others are turned off, and the charge of CR1 is discharged. As mentioned above, the charge of CR1 is collected to CR2–CR4 which are also charge-discharge capacitors, and then the charge of CR1 is discharged.

The same operation is also conducted for CR2. During t6, all switches except SC1 and SR2 are turned off, and CR2 is charged to be a supply voltage. During t7, SR2 and SR3 are turned on while the others are turned off, and the charge of CR2 is collected in CR3. During t8, SR2 and SR4 are turned on while the others are turned off, and the charge of CR2 is collected in CR4. During t9, SR2 and SR1 are turned on while the others are turned off, and the charge of CR2 is collected in CR1. During t10, SR2 and SD1 are turned on while the others are turned off, and charge of CR2 is discharged. In this way, the charge of CR1–CR4 is collected and recycled in order of CR3, CR4, CR1, CR2, CR3 and CR4.

In the second embodiment, it is possible to raise the charge collecting rate to 50% or more as in the first embodiment. Another advantage is that special charge collecting capacitors are not necessary because the charge-discharge capacitor is also used as a charge collecting capacitor.

Figure 11:
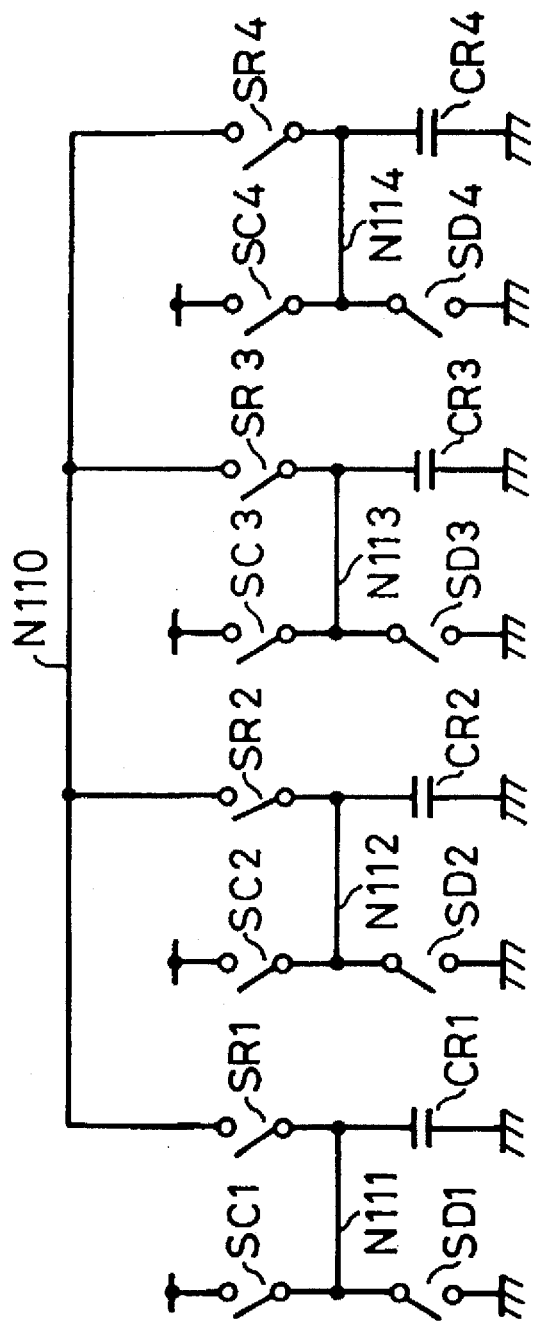
FIG. 11 is a circuit diagram which shows a concept of a charge recycling method conducted by using the semiconductor device according to the third embodiment of the invention.
Figure 12:
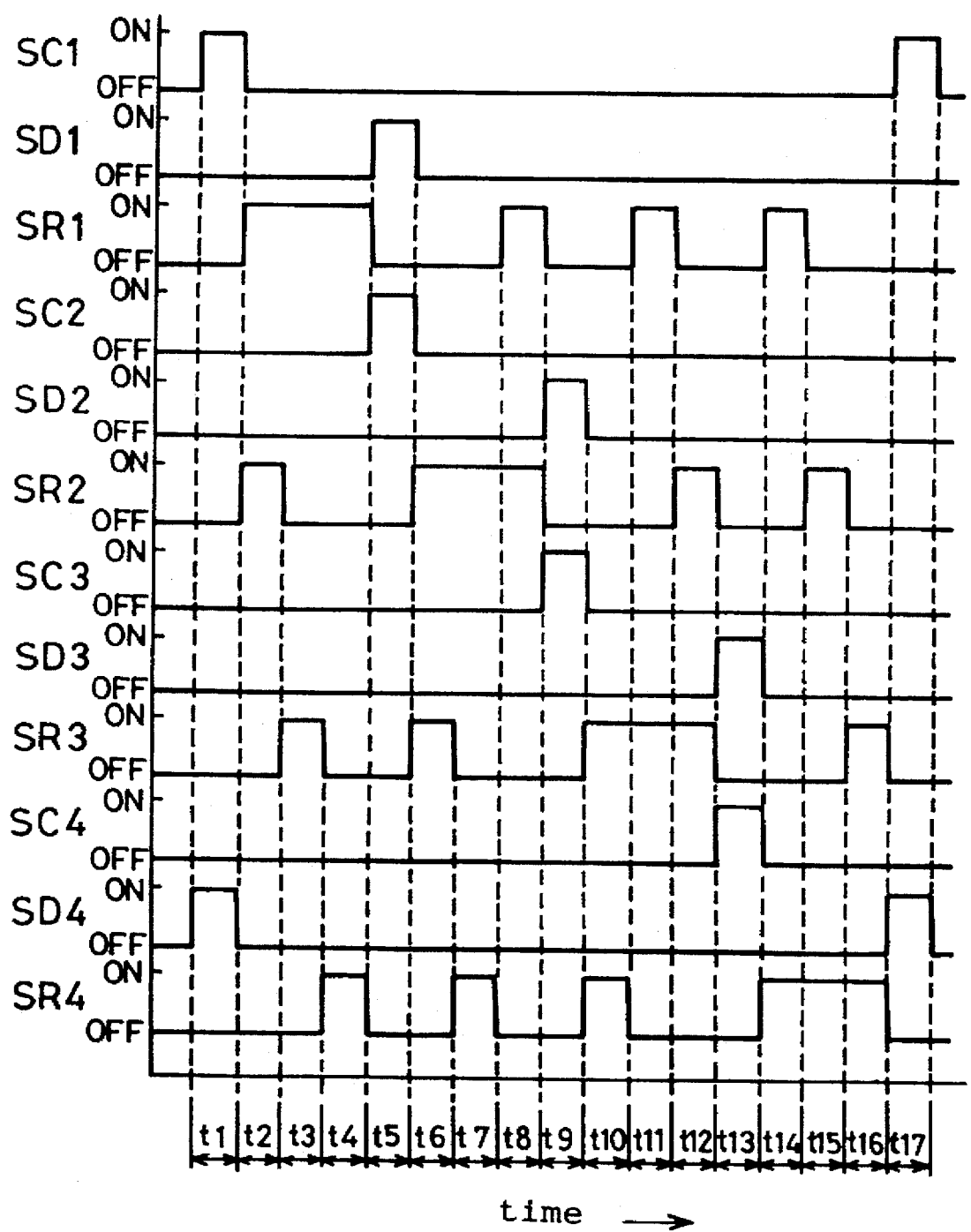
FIG. 12 shows the operation timing when the charge recycling is being operated with the semiconductor device of FIG. 11.

Next, a third embodiment is described by referring to FIG. 11 to show a circuit and FIG. 12 to show the timing.

CR1–CR4 are charge-discharge capacitors that also can be used as charge collecting capacitors. SC1–SC4 are switches for charging. SD1–SD4 are switches for discharging. SR1–SR4 are switches for connecting to charge-discharge capacitors. N110–N114 are nodes names, and t1–t17 are times.

Switches (SC1–SC4) are respectively connected between a supply voltage and nodes (N111–N114), switches (SD1–SD4) are respectively connected between ground voltage and nodes (N111–N114). CR1 to CR4 are respectively connected between nodes (N111–N114) and a ground voltage, and SR1–SR4 are respectively connected between N111 and the other nodes (N111–N114).

During t1, SC1 and SD4 are turned on while the others are turned off, and CR1 is charged to be a supply voltage while the charge of CR4 is discharged to ground voltage. During t2, SR1 and SR2 are turned on while the others are turned off, and the charge of CR1 is collected in CR2. During t3, SR1 and SR3 are turned on while the others are turned off, and the charge of CR1 is collected in CR3. During t4, SR1 and SR4 are turned on while the others are turned off, and the charge of CR1 is collected in CR4. During t5, SR1 and SD1 are turned on while the others are turned off, and CR2 is charged to supply voltage while the charge of CR1 is discharged to be a ground voltage. As mentioned above, the charge of CR1 is collected in CR2–CR4, which are also charge-discharge capacitors, and then the charge of CR1 is discharged. In this way, the charge of CR1–CR4 is collected and recycled in order of CR3, CR4, CR1, CR2, CR3 and CR4.

According to the third embodiment, it is possible to raise the charge collecting rate to 50% or more as in the case of the first embodiment. Another advantage is that a special charge collecting capacitor is not necessary because the charge-discharge capacitor is also used as a charge collecting capacitor. The third embodiment also enables shortening of the time to recycle the charge compared to the second embodiment, since it is possible to conduct charging and discharging of respective capacitors simultaneously. For example, during the time t1, CR1 is charged while CR4 is discharged.

Figure 13:
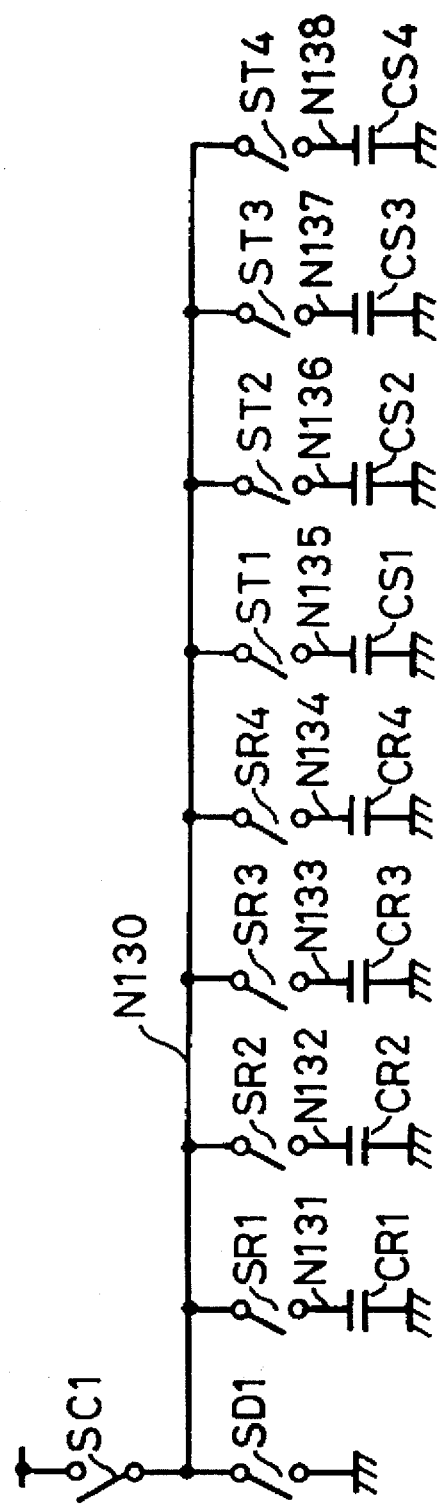
FIG. 13 is a circuit diagram which shows a concept of a charge recycling method conducted with the semiconductor device according to the fourth embodiment of the invention.
Figure 14:
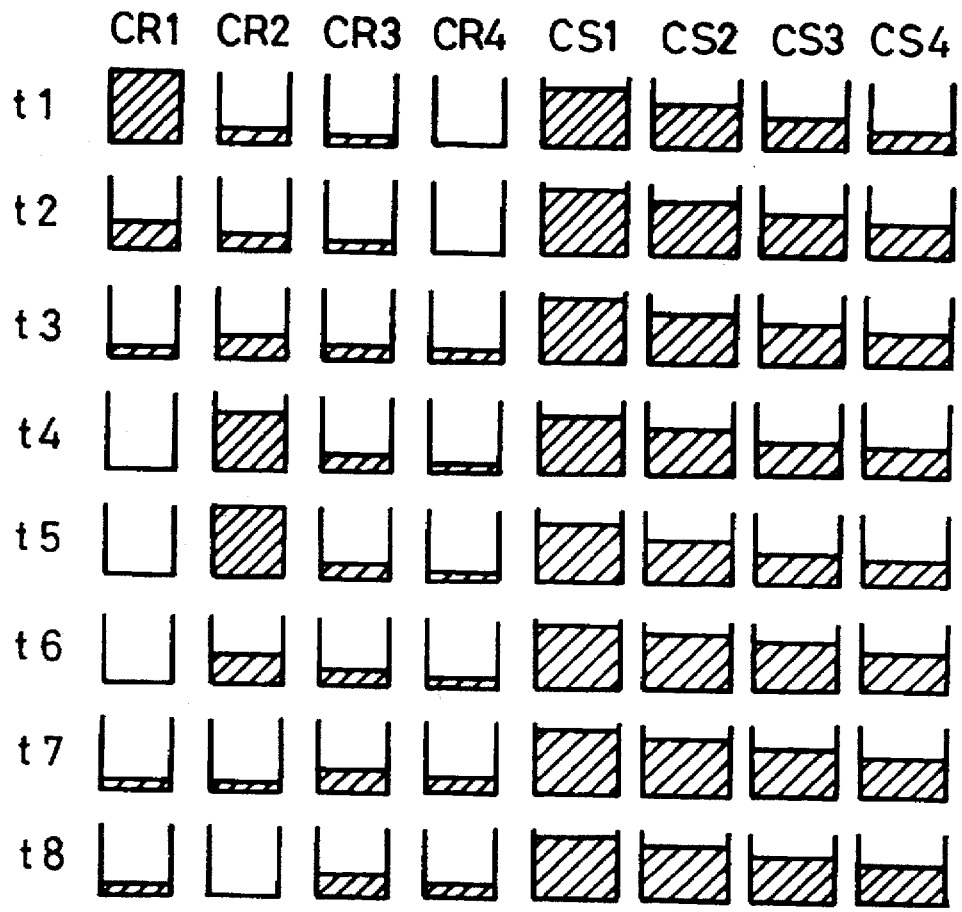
FIG. 14 shows the charging state of each capacitor when the charge recycling is being operated with the semiconductor device of FIG. 13.

Next, the fourth embodiment is described referring to FIG. 13 which shows a circuit and FIG. 14 which shows the charging state of each capacitor. In the figures, CR1–CR4 are charge-discharge capacitors. CS1–CS4 are charge collecting capacitors. SC1–SC4 are switches for charging. SD1–SD4 are switches for discharging. SR1–SR4 are switches for connecting charge-discharge capacitors. ST1–ST4 are switches for connecting charge collecting capacitors. N130–N138 are nodes names, and t1–t8 are times.

SC1 is connected between a supply voltage and N130. SD1 is connected between a ground voltage and N130. The charge-discharge capacitors (CR1–CR4) and charge collecting capacitors (CS1–CS4) are respectively connected between nodes (N131–N138) and a ground voltage, and the switches (SR1–SR4) and the switches (ST1–ST4) are respectively connected between N130 and the nodes (N131–N138).

The circuit of this embodiment is charged as shown in FIG. 14, by manipulating every switch in the same way as in the above-mentioned embodiments. This embodiment is designed by combining the first and second embodiments in order to collect charge more effectively. This embodiment enables the raising of the charge collecting rate to 50% or more as in the case of the first embodiment. Another advantage is that charge is collected effectively since the charge-discharge capacitor is also utilized as a charge collecting capacitor.

Figure 15:
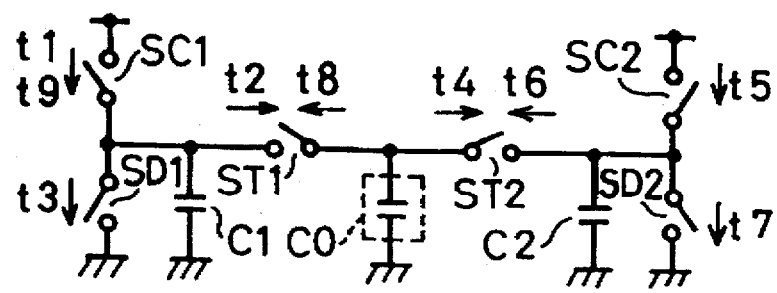
FIG. 15 is a circuit diagram which shows a concept of a charge recycling method conducted with the semiconductor device according to the fifth embodiment of the invention.
Figure 16:
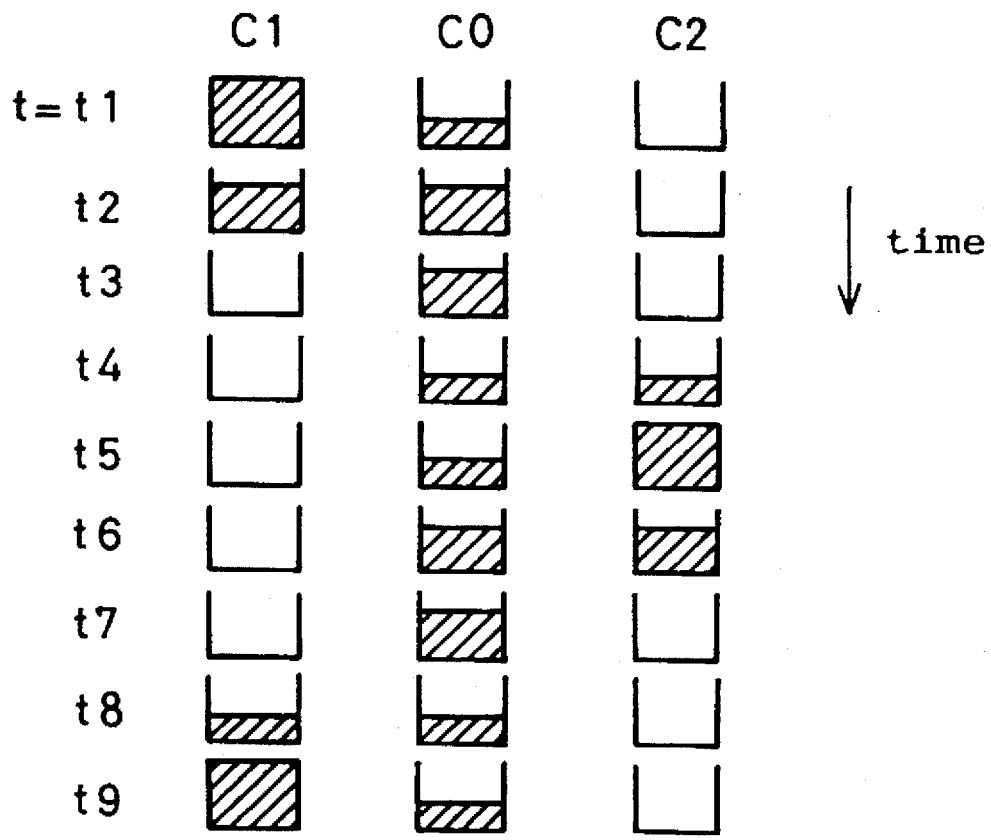
FIG. 16 shows the charging state of each capacitor when the charge recycling is being operated with the semiconductor device of FIG. 15.

The fifth embodiment is described referring to FIG. 15, which shows a circuit and FIG. 16, which shows the charging state of each capacitor. This embodiment is characterized by the method to set the charge collecting capacitor in order to raise the charge collecting rate. In the following case, the fourth embodiment is simplified to have only one charge collecting capacitor.

C0, C1 and C2 are capacitors, SC1 and SC2 are switches to charge the capacitors (C1 and C2) respectively. SD1 and SD2 are switches to discharge the capacitors (C1 and C2) respectively. ST1 and ST2 are switches to connect electrically the capacitor (C1) and the other capacitors (C0 and C2).

A first electrode of C1 is connected to a ground voltage, and a second electrode is connected to a supply voltage via SC1 and to the ground voltage via SD1. In the same way, a first electrode of C2 is connected to a ground voltage, and a second electrode is connected to a supply voltage via SC2 and to the ground voltage via SD2. A first electrode of C0 is connected to the ground voltage, the second electrodes of C1 and of C0 are connected to each other via ST1, and the second electrodes of C2 and of C0 are connected to each other via ST2. In FIG. 15, the moving directions of the charge during t1–t9 are shown with arrows. In FIG. 16, the amounts of charges of the capacitors (C1, C0, C2) are shown at times (t1–t9).

The switch (SC1) is turned on during t1 to charge the capacitor C1 up to the supply voltage. Then ST is turned on during t2, and the charge of C1 moves to C0 to be collected. SD1 is turned on during t3 and the charge of C1 is discharged. ST2 is turned on during t4, and the charge of C0 moves to C2 and the charge is recycled. During t5 SC2 is turned on and C2 is charged up to the supply voltage. During t6, ST2 is turned on and the charge of C2 moves to C0 to be recycled. During t7, SD2 is turned on and the charge of C2 is discharged. During t8, ST1 is turned on and the charge of C0 is moved to C1 and recycled. During t9, SC1 is turned on and C1 is charged up to the supply voltage. Thus the condition goes back to that of t1.

As mentioned above, the charge of C1 and C2 is collected to C0 when C1 and C2 are charged and discharged respectively, and then the charge is moved to C1 and C2 to be recycled. In addition to this embodiment in which C1 and C2 are operated in turn, it is possible to recycle charge by continuous operation of C1. The charge recycling rate depends on the number of times of the charge collection and the ratio of the capacitors (C1, C2) to the charge collecting capacitor (C0).

Figure 17:
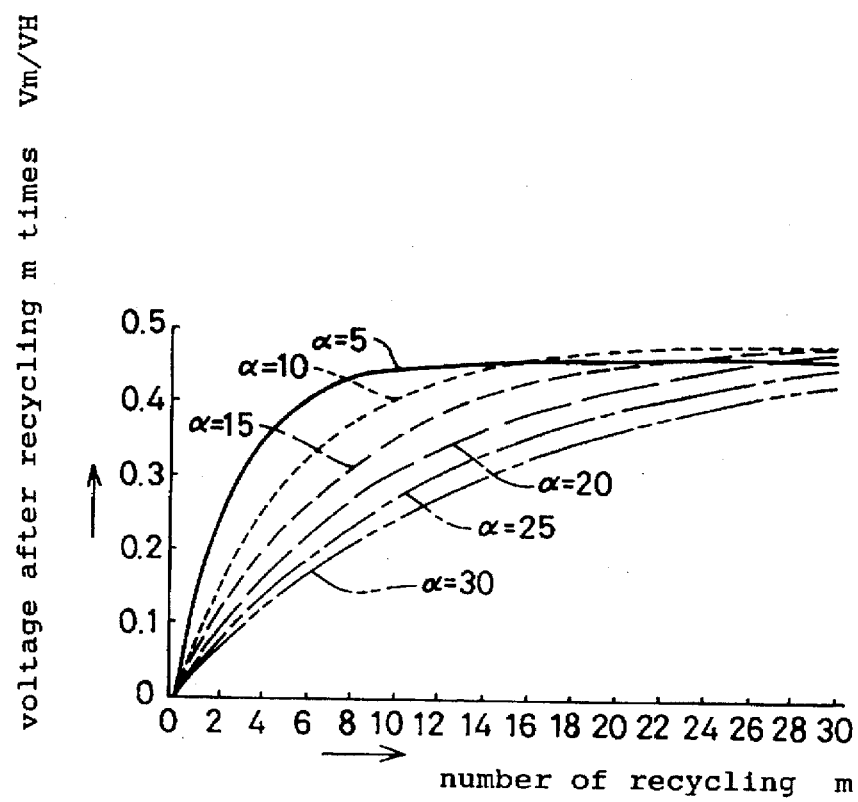
FIG. 17 is a graph to indicate the relation between the number of charge recyclings and the electric potential after the charge recyclings.

FIG. 17 shows the relation between the number of times of charge recycling and the electrical potential after the charge recyclings, with respect to the charge recycling rate for the charge recycling method of this invention. The ratio of C0 to C1 in the circuit to show the concept of the charge recycling method of FIG. 15 can be expressed as $\alpha = C0/C1$.

$$V_m = \alpha/(1+2\alpha) \times (1-(\alpha/(1+\alpha))^{2m}) \times VH$$

In this formula, VH is the maximum voltage of the second electrode of C1 when SC1 is turned on, and Vm is the voltage of the second electrode of C1 after the recycling of charge for m times (m should be an integer), when m=o, and Vm=0. In FIG. 17, the horizontal axis shows the number of times of recycling (m) when $\alpha$ is 5, 10, 15, 20, 25, or 30. And the vertical axis shows the value of Vm divided by VH when Vm is the voltage of the second electrode of C1 after recycling m times.

The figures clearly show that the value of Vm/VH becomes high as the number of recycling (m) is bigger. When $\alpha$ is bigger, the value of Vm/VH becomes low after recycling, while the value becomes high if m is quite big.

Figure 18:
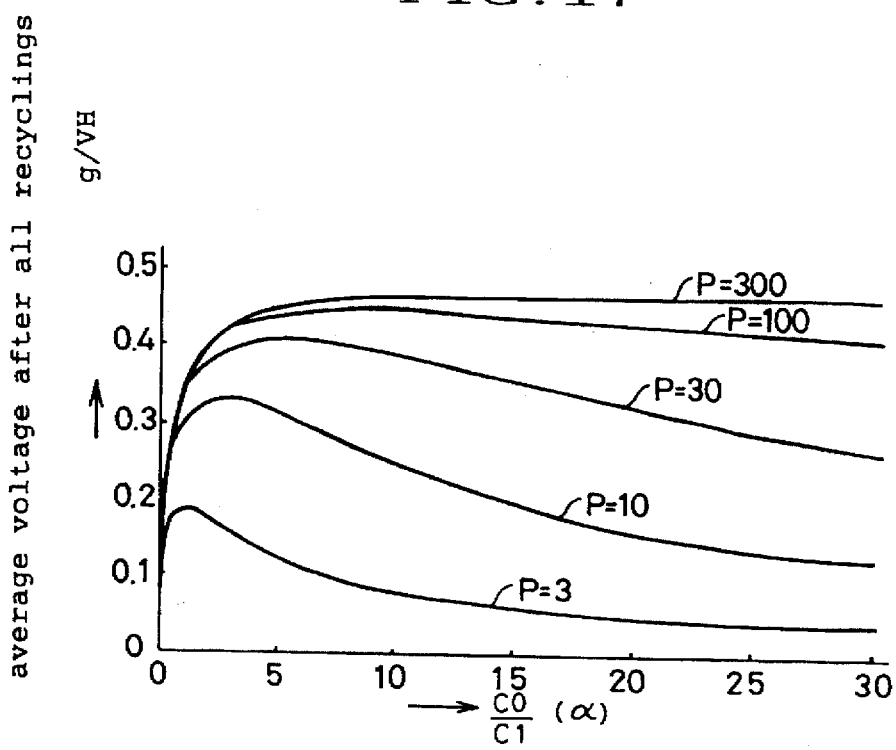
FIG. 18 is a graph to indicate the relation between the charge collecting capacitor and the charge recycling rate per recycling.

When recycling is conducted P times (P is an integer), the following formula holds:

$$g(\alpha, P) = \Sigma(m=0, (P-1)) V_m/P$$
$$= \alpha/P \times A \times A \times (B^{2P} - P \times B \times B + P - 1) \times VH$$

wherein the voltage after the average recycling per number after all of the recyclings is expressed as $g(\alpha, P)$, and $A = (1+\alpha)/(1+2\alpha);$ $B = \alpha/(1+\alpha)$ In FIG. 18, $\alpha$ is the ratio of C0 to C1, and $g(\alpha,P)/VH$ is the voltage after an average recycling. The voltage, $g(\alpha,P)/VH$ means the charge collecting rate.

For example, $\alpha$ is set to be about 1.5, 3, or 6 when the number of times of recycling (P) is 3, 10, or 30 respectively, so that $g(\alpha, P)/VH$, or the charge collecting rate, can be maximized. When a device is designed with the number of recycling (P) as 10 or less, the value of $\alpha$ should be 3 or more. In the case of another device, when the number (P) is about 100 and $\alpha$ is about 10, the charge collecting rate is about 44%.

C1 is not necessarily one capacitor, but it is also possible to be composed with plural charge collecting capacitors which have switches independently, as shown in the first embodiment.

Figure 19:
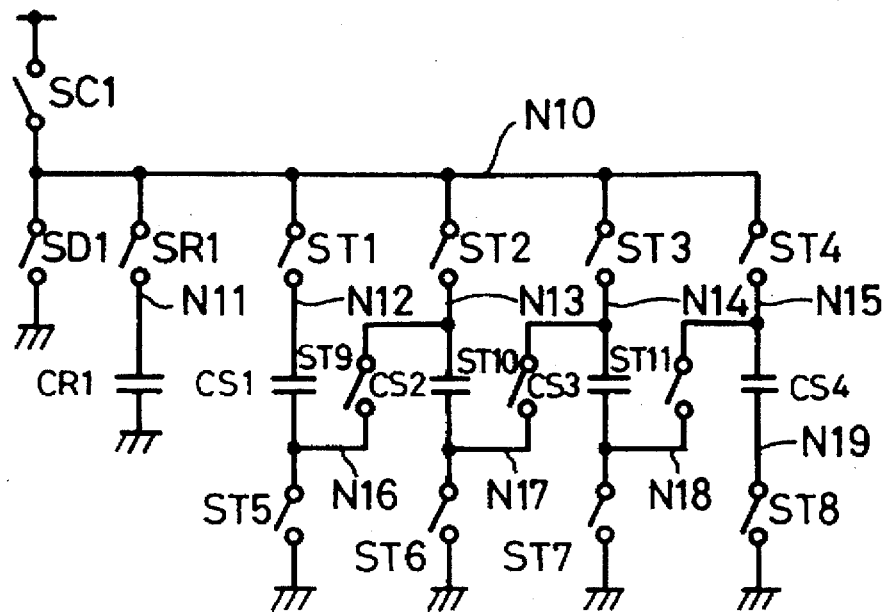
FIG. 19 is a circuit diagram which shows a concept of a charge recycling method conducted with the semiconductor device according to the sixth embodiment of the invention.
Figure 20:
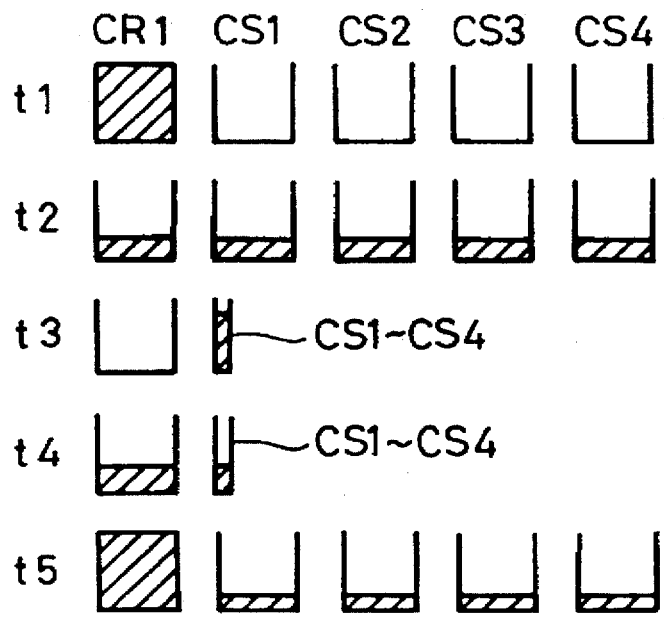
FIG. 20 shows the charging state of each capacitor when the charge recycling is being operated within the semiconductor device of FIG. 19.
Figure 21:
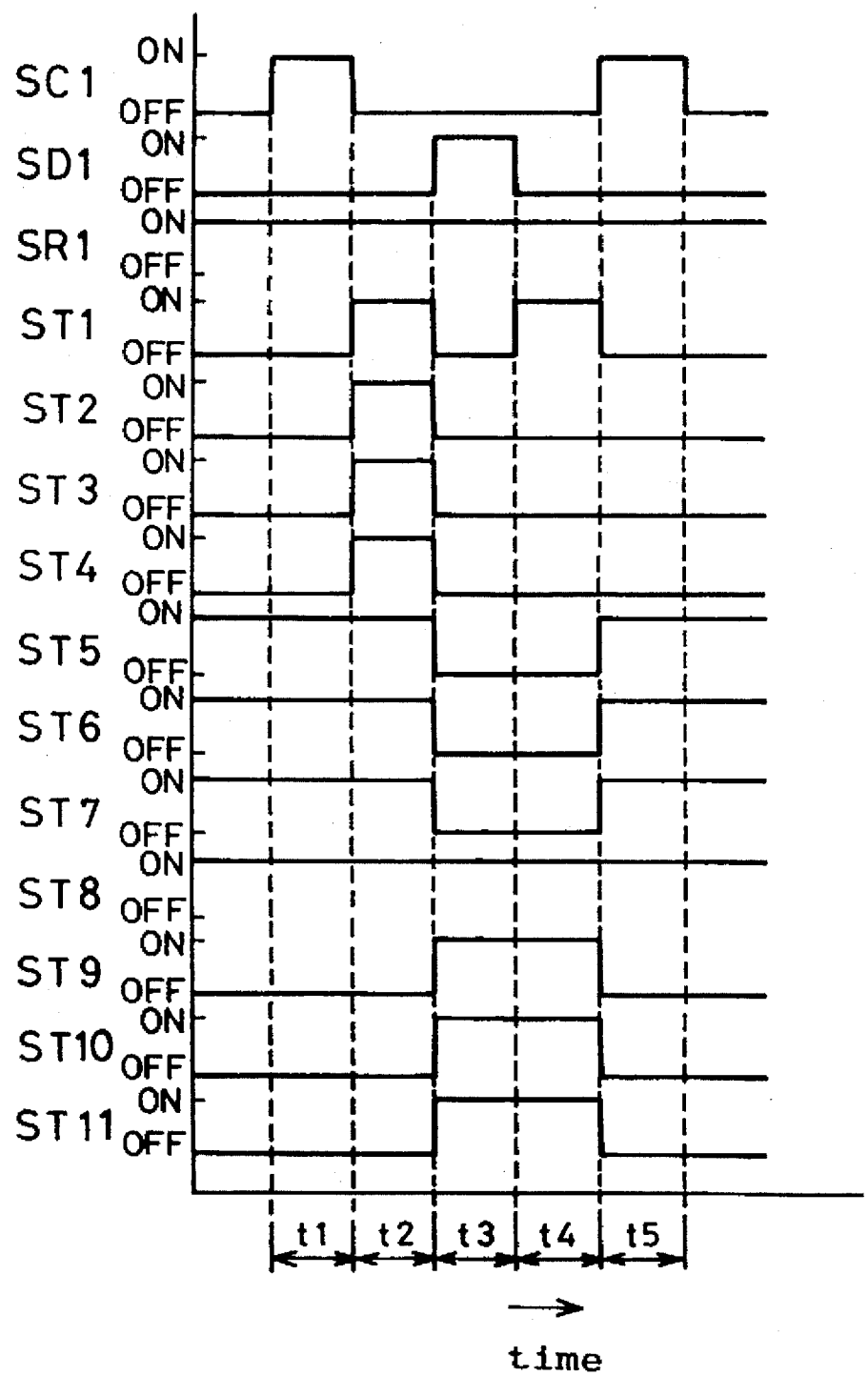
FIG. 21 shows the operation timing when the charge recycling is being operated with the semiconductor device of FIG. 19.

The sixth embodiment is described below referring to FIG. 19, which shows a circuit, FIG. 20, which shows the state of charging of each of the capacitors, and also FIG. 21, which shows the timing.

In the figures, CR1 is a charge-discharge capacitor. CS1–CS4 are charge collecting capacitors. SC1 is a switch for charging. SD1 is a switch for discharging. ST1–ST11 are switches for switching parallel connection and series connection of the charge collecting capacitor and also switching charge collection and recycling. N10–N19 are nodes names, and t1–t5 are times.

SC1 is connected between a supply voltage and N10. SD1 is connected between a ground voltage and N10. SR1 is connected between N10 and another node (N11). CR1 is connected between N11 and the ground voltage. ST1–ST4 are respectively connected between N11 and other nodes (N12–N15). CS1–CS4 are respectively connected between the nodes (N12–N15) and other nodes (N16–N19). ST5–ST8 are respectively connected between the nodes (N16–N19) and the ground voltage. And ST9–ST11 are relatively connected between nodes (N13–N15) and other nodes (N16–N18).

During time t1, some switches (SC1, SR1, ST5–ST8) are turned on while others are turned off, and CR1 is charged to be a supply voltage. During t2, SC1 is turned off while ST1–ST4 are turned on, and the charge stored in CR1 is collected in the charge collecting capacitors (CS1–CS4), which are connected in parallel. During t3, SD1 and ST9–ST11 are turned on while ST1–ST7 are turned off, and the charge of CR1 is discharged, with CS1–CS4 connected in series. During t4, SD1 is turned off while ST1 is turned on, charge is collected from and charge collecting capacitors (CS1–CS4) which are connected to CR1 in series. During t5, SC1, SR1 and ST5–ST8 are turned on while the others are turned off, and the condition goes back to that of t1, and CR1 is charged up to a supply voltage. By repeating this work, the charge of CR1 is collected in the charge collecting capacitor and recycled.

In the sixth embodiment, charge is collected as much as possible by connecting charge collecting capacitors in parallel and lowering the potential level. When the charge is recycled, charge collecting capacitors are connected in series and raise the potential level, so that charge can be recycled as much as possible. As a result, the charge collecting rate is raised and the amount of consumed electric power is decreased. In this embodiment, the charge collecting rate can be raised to at least 50% (for example, 70%), depending on the values of the charge-discharge capacitance and the charge collecting capacitance, and also depending on the number of the charge collecting capacitors. The method explained here can be also applied to self-refresh operation of DRAM shown in the conventional technique.

Figure 22:
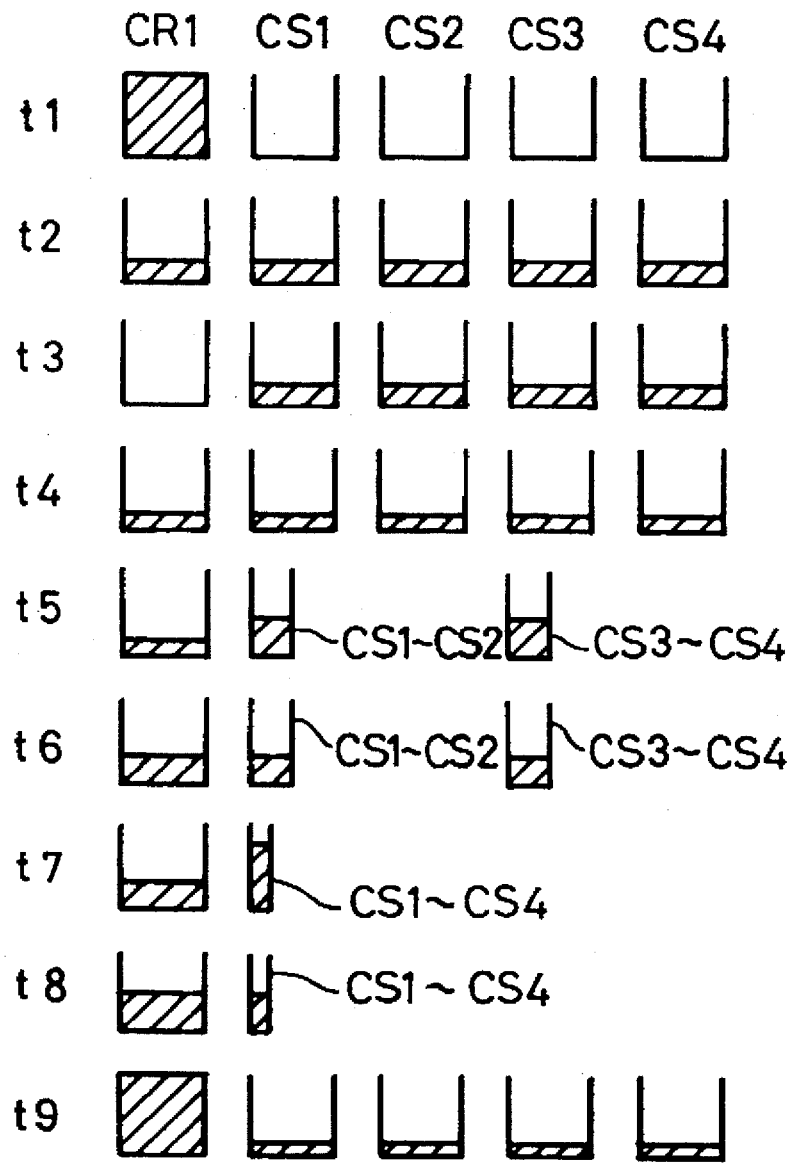
FIG. 22 shows the charging state of each capacitor when charge recycling operation is conducted with the semiconductor device according to the seventh embodiment of the invention.
Figure 23:
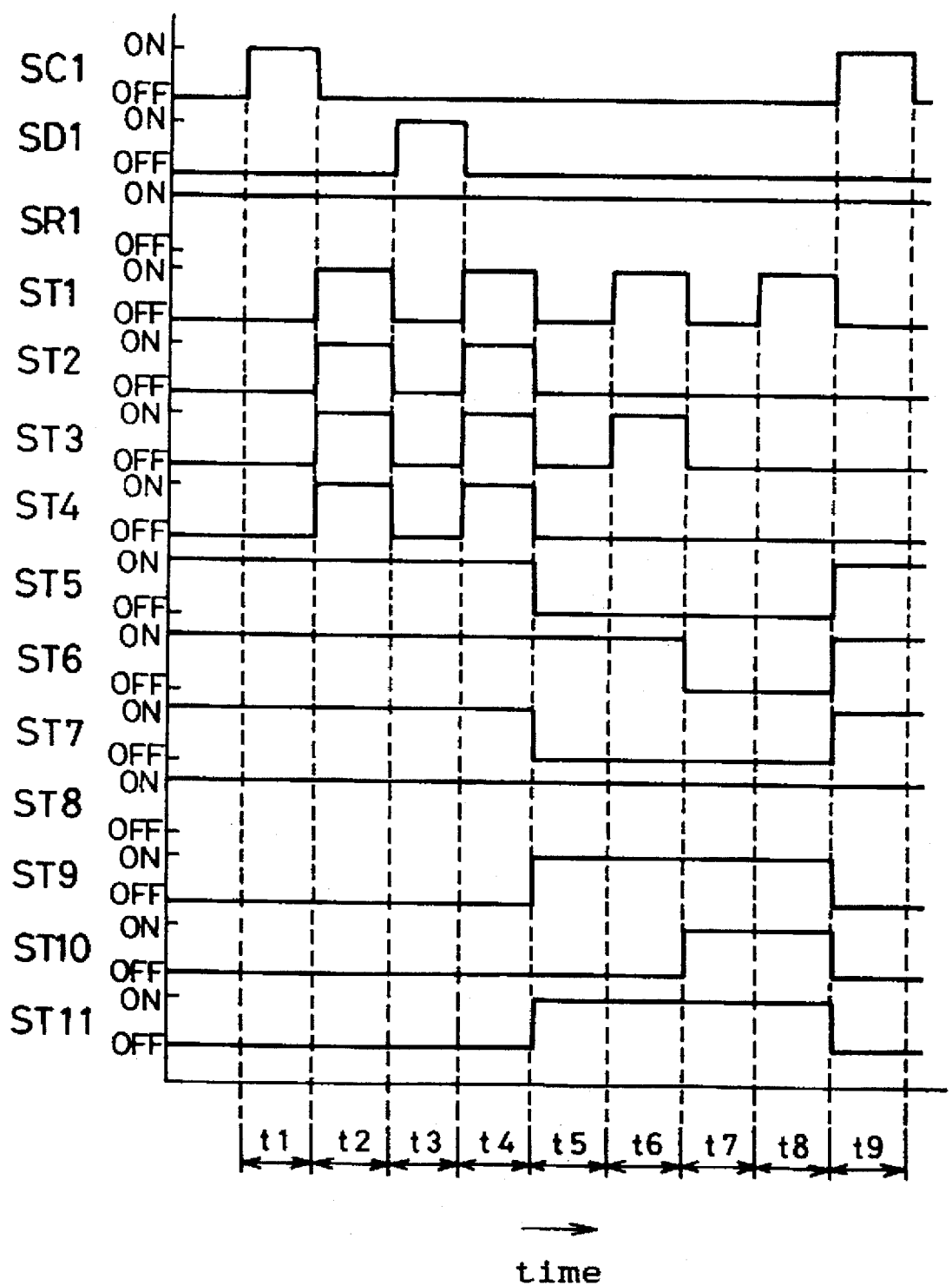
FIG. 23 shows the operation timing when the charge recycling is being operated with the semiconductor device of FIG. 22.
Figure 24:
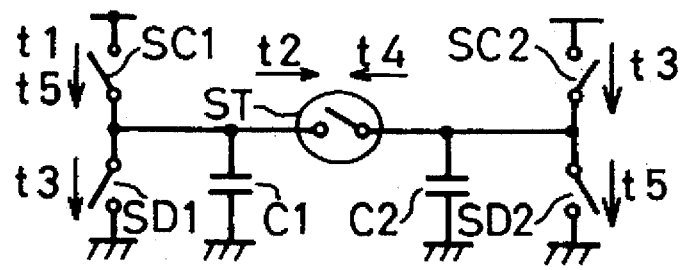
FIG. 24 is a circuit diagram which shows a concept of a charge recycling method conducted with the semiconductor device of the conventional technique.
Figure 25:
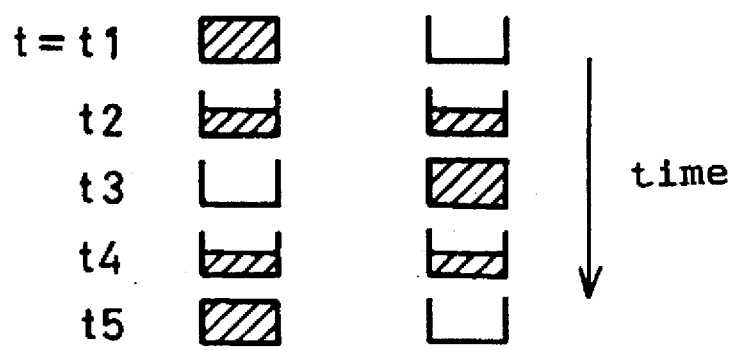
FIG. 25 shows the charging state of each capacitor when the charge recycling is being operated with the semiconductor device of FIG. 24.
Figure 26:
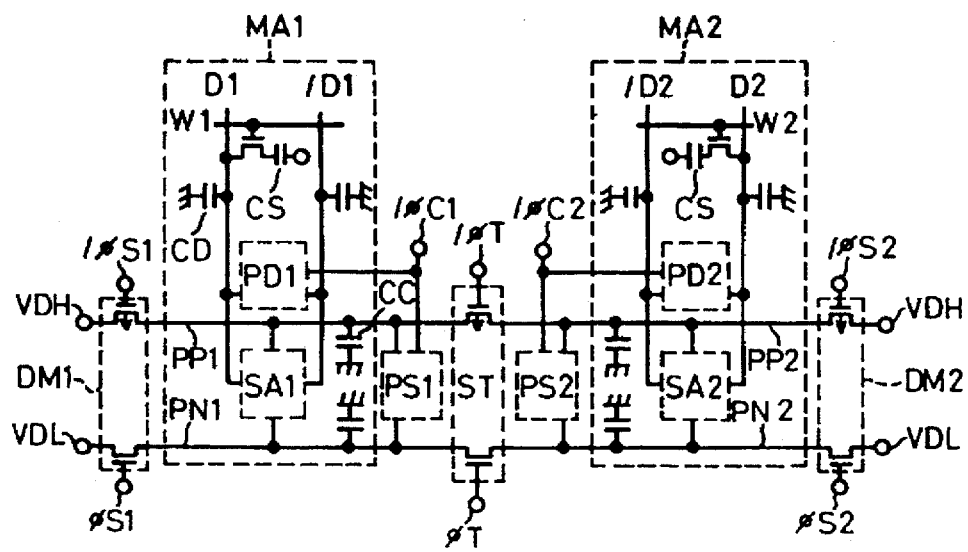
FIG. 26 is a circuit diagram in which a charge recycling method by the semiconductor device of FIG. 24 is applied to the self-refresh operation of DRAM.
Figure 27:
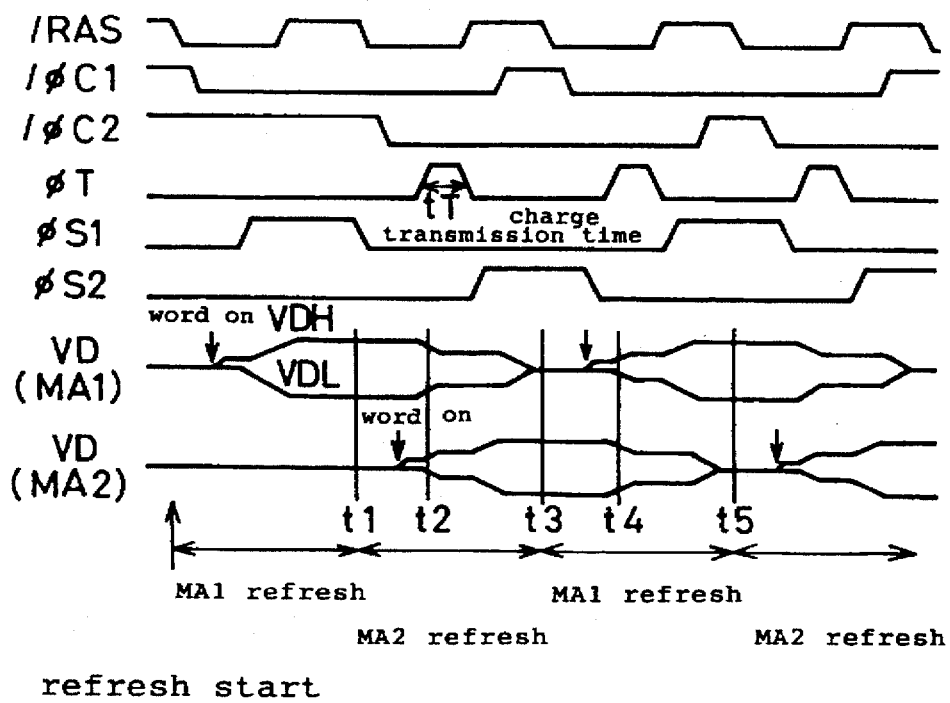
FIG. 27 shows the operation timing during the charge recycling in the self-refresh operation of DRAM of FIG. 26.

The seventh embodiment is described below referring to FIG. 22 which shows the state of charging of each of the capacitors and FIG. 23 which shows the timing.

During time t1, some switches (SC1, SR1, ST5–ST8) are turned on while others are turned off, and CR1 is charged up to a supply voltage. During t2, SC1 is turned off while ST1–ST4 are turned on, and the charge of CR1 is collected in the charge collecting capacitors (CS1–CS4), which are connected in parallel. During t3, SD1 is turned on while ST1–ST4 are turned off, and the charge of CR1 is discharged to a ground voltage. During t4, SD1 is turned off while ST1–ST4 are turned on, and charge is collected from charge collecting capacitors (CS1–CS4), which are connected to CR1 in parallel. During t5, ST1–ST5 and ST7 are turned off while ST9 and ST11 are turned on, and charge collecting capacitors (CS1–CS2) and other charge collecting capacitors (CS3–CS4) are respectively connected in series. During t6, ST1 and ST3 are turned on and charge is collected from CS1–CS2 connected in series to CR1 and further from CS3–CS4 which are connected in series. During t7, switches (ST1, ST3, ST7) are turned off while ST10 is turned on, and CS1–CS4 are connected in series. During t8, ST1 is turned on and further charge is collected from CS1–CS4 which are connected in series. During t9, switches (SC1, SR1, ST5–ST8) are turned on while the others are turned off. Thus the condition is as same as that of t1, and charge-discharge capacitor CR1 is charged to be a supply voltage. By repeating this work, the charge of CR1 is collected in the charge collecting capacitor and recycled.

In the seventh embodiment, like the sixth embodiment, charge is collected as much as possible by connecting charge collecting capacitors in parallel and lowering the potential level. When the charge is recycled, charge collecting capacitors are connected in series to raise the potential level, so that charge can be recycled as much as possible. Moreover, charge collecting capacitors connected in series are divided to raise the potential level in order to recycle charge as much as possible.

This invention permits a semiconductor device to realize a higher charge recycling rate which is 50% or more, and can decrease the amount of electric power to be consumed. This is practical because charge to be collected moves to the charge collecting capacitors in order of the electric potential (in other words, charge of a charge collecting capacitor with the highest potential moves first), and charge to be recycled moves from the charge collecting capacitors in the reverse order of the electric potential. In addition, charge to be collected moves from the charge-discharge capacitors in order of the electric potential (in other words, charge of a charge-discharge capacitor with the highest potential first), and charge to be recycled moves to the charge-discharge capacitors in the reverse order of the electric potential. Furthermore, it is possible to recycle charge in the operation node of charge and discharge of the identical memory-cell-array. It is also possible that connections of at least two electric charge collecting capacitors are switched to parallel or series, in order to collect the charge to the charge collecting capacitors connected in parallel, and recycle the charge of the charge collecting capacitors connected in series. As a result, more charge can be collected and less power will be needed.

This invention may be embodied in other forms without departing from the spirit or essential characteristics thereof. The embodiments disclosed in this application are to be considered in all respects as illustrative and not limitative, the scope of the invention is indicated by the appended claims rather than by the foregoing description, and all changes which come within the meaning and range of equivalency of the claims are intended to be embraced therein.

What is claimed is:

1. A semiconductor device which has charge recycling means comprising a charge-discharge capacitor and plural charge collecting capacitors, the charge-discharge capacitor and the charge collecting capacitors being coupled via switches, wherein charge to be collected moves from the charge-discharge capacitor to the charge collecting capacitors in order of the electric potential of the charge collecting capacitors, with the charge first moving to a charge collecting capacitor with the highest electric potential.

2. A semiconductor device which has charge recycling means comprising a charge-discharge capacitor and plural charge collecting capacitors, the charge-discharge capacitor and the charge collecting capacitors being coupled via switches, wherein charge to be recycled moves to the charge-discharge capacitor from the charge collecting capacitors in order of the potential of the charge collecting capacitors, with the charge first moving from a charge collecting capacitor with the lowest electric potential.

3. A semiconductor device which has charge recycling means comprising a charge-discharge capacitor and plural charge collecting capacitors, the charge-discharge capacitor and the charge collecting capacitors being coupled via switches, wherein charge to be collected moves to one of the charge collecting capacitors from the charge-discharge capacitor and then moves to the other charge collecting capacitors in order of the potential of the charge collecting capacitors, with the charge first moving from said one of the charge collecting capacitors to another charge collecting capacitor that has the highest electric potential.

4. A semiconductor device which has charge recycling means comprising a charge-discharge capacitor and plural charge collecting capacitors, the charge-discharge capacitor and the charge collecting capacitors being coupled via switches, wherein charge to be recycled moves from one of the charge collecting capacitors to the charge-discharge capacitor and then moves from the other charge collecting capacitors in order of the potential of the charge collecting capacitors, with the charge first moving from the remaining charge collecting capacitor with the lowest electric potential.

5. A semiconductor device which has a charge recycling means comprising a charge-discharge capacitor and plural charge collecting capacitors, the charge-discharge capacitor and the charge collecting capacitors being coupled via switches, wherein the value of the charge collecting capacitors is set to realize a maximum charge recycling rate when charge moves from the charge-discharge capacitor to the charge collecting capacitors and then moves back to be recycled to the charge-discharge capacitor.

6. A semiconductor device which has charge recycling means comprising plural charge-discharge capacitors and plural charge collecting capacitors, the charge-discharge capacitors and the charge collecting capacitors being coupled via switches, wherein charge to be collected moves from the charge-discharge capacitors in order of electric potential of the charge-discharge capacitors, with charge moving first from a charge-discharge capacitor with the lowest electric potential.

7. A semiconductor device which has charge recycling means comprising plural charge-discharge capacitors and plural charge collecting capacitors, the charge-discharge capacitors and the charge collecting capacitors being coupled via switches, wherein charge to be recycled moves from the charge collecting capacitors in order of electric potential of the charge collecting capacitors, with charge moving first from the charge collecting capacitor with the lowest electric potential.

8. A semiconductor device which has charge recycling means comprising plural charge-discharge capacitors and plural charge collecting capacitors, the charge-discharge capacitors and the charge collecting capacitors being coupled via switches, wherein charge to be collected moves from one of the charge-discharge capacitors to one of the charge collecting capacitors and then to the other charge collecting capacitors in order of the electric potential of the charge collecting capacitors, with charge moving first to the remaining charge collecting capacitor with the highest electric potential.

9. A semiconductor device which has charge recycling means comprising plural charge-discharge capacitors and plural charge collecting capacitors, the charge-discharge capacitors and the charge collecting capacitors being coupled via switches, wherein charge to be recycled moves from one of the charge collecting capacitors to one of the charge-discharge capacitors and then from the other charge collecting capacitors in order of the potential of the charge collecting capacitors, with charge moving from the remaining charge collecting capacitor with the lowest electric potential.

10. A semiconductor device which has charge recycling means comprising plural charge-discharge capacitors and plural charge collecting capacitors, the charge-discharge capacitors and the charge collecting capacitors being coupled via switches, wherein the values of the charge-discharge capacitors and of the charge collecting capacitors are set to realize a maximum charge recycling rate when charge moves from the charge-discharge capacitors to the charge collecting capacitors and moves back to be recycled to the charge-discharge capacitors.

11. A semiconductor device which has charge recycling means comprising a first capacitor and a second capacitor which is a charge collecting capacitor, wherein the first capacitor is connected to a power source for charging via a first switch and also is connected to a circuit for discharging via a second switch, and the first and the second capacitors are connected to each other via a third switch.

12. The semiconductor device according to claim 11, which has charge recycling means, wherein charge moves from the second capacitor to the first capacitor via the third switch, and moves from the power source to the first capacitor via the first switch, and moves from the first capacitor to the second capacitor via the third switch in order to be collected, and moves from the first capacitor to the circuit for discharging via the second switch.

13. The semiconductor device according to claim 11, which has charge recycling means, wherein the capacitance value of the second capacitor is set to equal or exceed the value to maximize the average amount of collected charge if charge is collected at least twice.

14. A semiconductor device which has charge recycling means comprising one charge collecting capacitor and plural second capacitors, wherein the plural second capacitors are connected to a power source for charging via a plurality of first switches and also connected to a circuit for discharging via a plurality of second switches, and the charge collecting capacitor and each of the plural capacitors are connected to each other via a plurality of third switches.

15. A semiconductor device which has charge recycling means comprising a charge-discharge capacitor and plural charge collecting capacitors.

16. The semiconductor device according to claim 15, which has charge recycling means, wherein at least some of the charge collecting capacitors can be switched between parallel connection and series connection.

17. The semiconductor device according to claim 16, which has charge recycling means, wherein charge to be collected moves to the charge collecting capacitors when at least some of the charge collecting capacitors are connected in parallel.

18. The semiconductor device according to claim 16, which has charge recycling means, wherein charge of the charge collecting capacitors is recycled when at least some of the charge collecting capacitors are connected in series.

19. A semiconductor device which has charge recycling means, comprising a plurality of charge collecting capacitors, wherein the charge of the charge collecting capacitors is first recycled while a given number (N) of the charge collecting capacitors are connected in series, and then the charge of the charge collecting capacitors is recycled while N+1 charge collecting capacitors are connected in series, wherein N is at least two.

20. A semiconductor device which has charge recycling means comprising at least three charge-discharge capacitors, wherein the charge of the first charge-discharge capacitor to be collected moves to the second and the third charge-discharge capacitors.

21. A semiconductor device which has charge recycling means comprising at least three charge-discharge capacitors, wherein the charge of the first charge-discharge capacitor to be collected moves to the second and the third charge-discharge capacitors in order of electric potential of the second and third charge-discharge capacitors, with charge moving first to one of the second and third charge-discharge capacitors with the higher electric potential.

22. A semiconductor device which has charge recycling means comprising at least three charge-discharge capacitors, wherein the charge of the second and third charge-discharge capacitors to be recycled moves to the first charge-discharge capacitor in order of electric potential of the second and third charge-discharge capacitors, with charge moving first from the one of the second and third charge-discharge capacitors with the lower electric potential.

* * * * *